United States Patent [19]

Onda et al.

[11] Patent Number: 5,395,482
[45] Date of Patent: Mar. 7, 1995

[54] ULTRA HIGH PURITY VAPOR PHASE TREATMENT

[75] Inventors: Shinzaburo Onda; Kaoru Nozaki; Norihiko Kato, all of Miyagi, Japan

[73] Assignee: Fuji Photo Film Co., Ltd., Kanagawa, Japan

[21] Appl. No.: 151,858

[22] Filed: Nov. 15, 1993

[30] Foreign Application Priority Data

| Nov. 13, 1992 | [JP] | Japan | 4-303674 |
| Apr. 15, 1993 | [JP] | Japan | 5-088433 |
| Apr. 15, 1993 | [JP] | Japan | 5-088434 |
| Apr. 15, 1993 | [JP] | Japan | 5-088435 |

[51] Int. Cl.$^6$ ............ B44C 1/22; C03C 15/00; C03C 25/06
[52] U.S. Cl. ............ 156/646; 134/31; 156/657; 156/345
[58] Field of Search ............ 156/646, 657, 345; 134/3, 31

[56] References Cited

U.S. PATENT DOCUMENTS

| 5,174,855 | 12/1992 | Tanaka | 156/646 |
| 5,282,925 | 2/1994 | Jeng et al. | 156/646 |

FOREIGN PATENT DOCUMENTS

| 60-69531 | 4/1985 | Japan | G01N 1/28 |
| 60-164330 | 8/1985 | Japan | H01L 21/306 |

OTHER PUBLICATIONS

Pre-prints 2C13 of 1992 Annual Meeting of The Japan Society for Analytical Chemistry.
Technical Study Report SMD 91-159, the Institute of Electronics, Information, and Communication Engineers of Japan.
J. Vac. Sci. Technol., vol. 7, or A7, No. 3, May/Jun. 1989, pp. 1719-1723.
*The Practical Handbook for ULSI Manufacturing System,* issued by Scienceforum Ltd., Japan, Nov. 30, 1991.
*Excalibur,* Hydrofluoric Acid Anhydride Gas Process System, developed by Texas Institute of Technology and FSI Ltd.

*Primary Examiner*—William Powell
*Attorney, Agent, or Firm*—Sughrue, Mion, Zinn, Macpeak & Seas

[57] ABSTRACT

A semiconductor wafer vapor phase treatment method and apparatus for dissolving an insulating film formed on a semiconductor wafer at a high speed and high purity. A liquid reagent is heated and vaporized to obtain reagent vapors capable of dissolving an object to be treated. The reagent vapors are passed through a hydrophobic porous film to intercept mists having a diameter greater than a predetermined value and obtain high purity reagent vapors. The purified reagent vapors are supplied to the cooled object. The vapors which dissolved the object are liquidized to generate droplets.

44 Claims, 28 Drawing Sheets

FIG.11A
FIG.11B
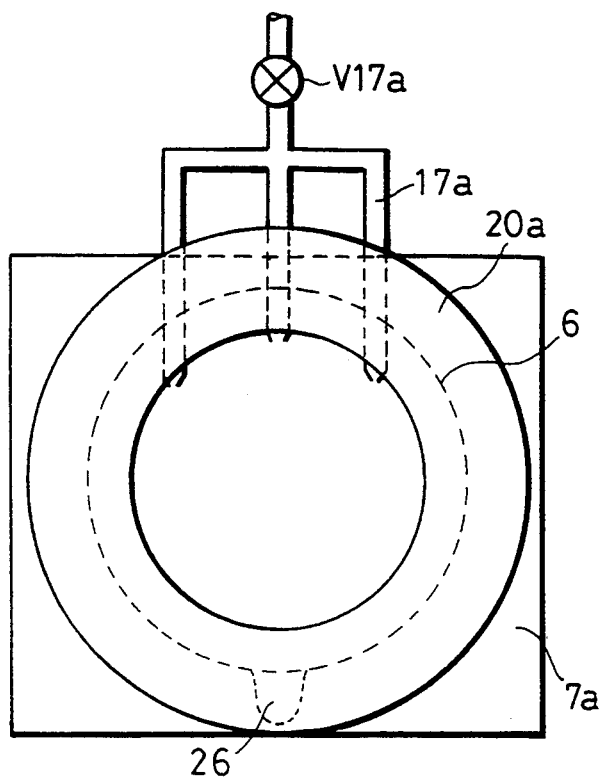
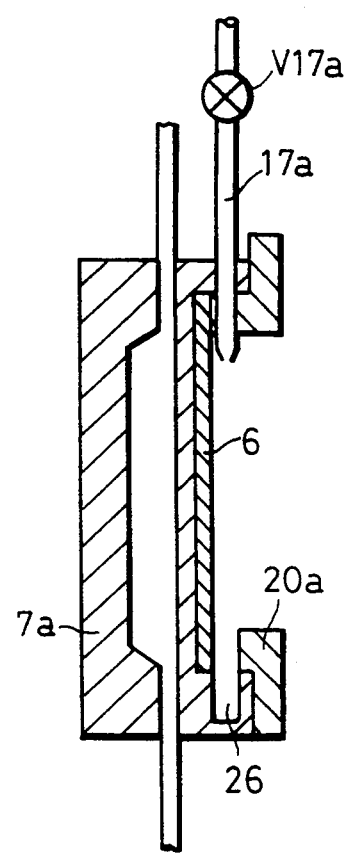

ETCHING TIME FOR 1000 Å SiO2 FILM

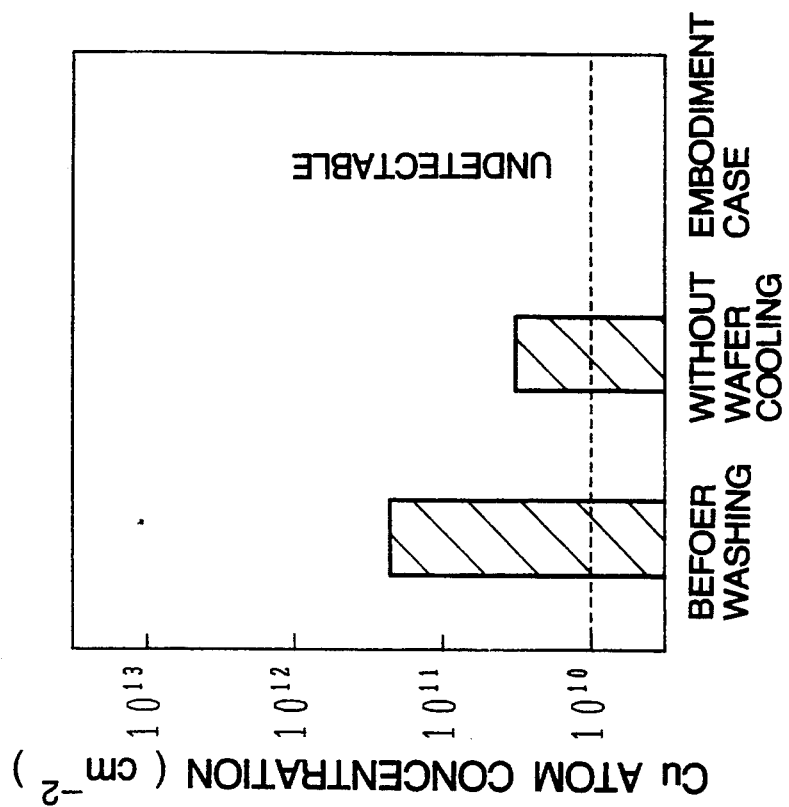
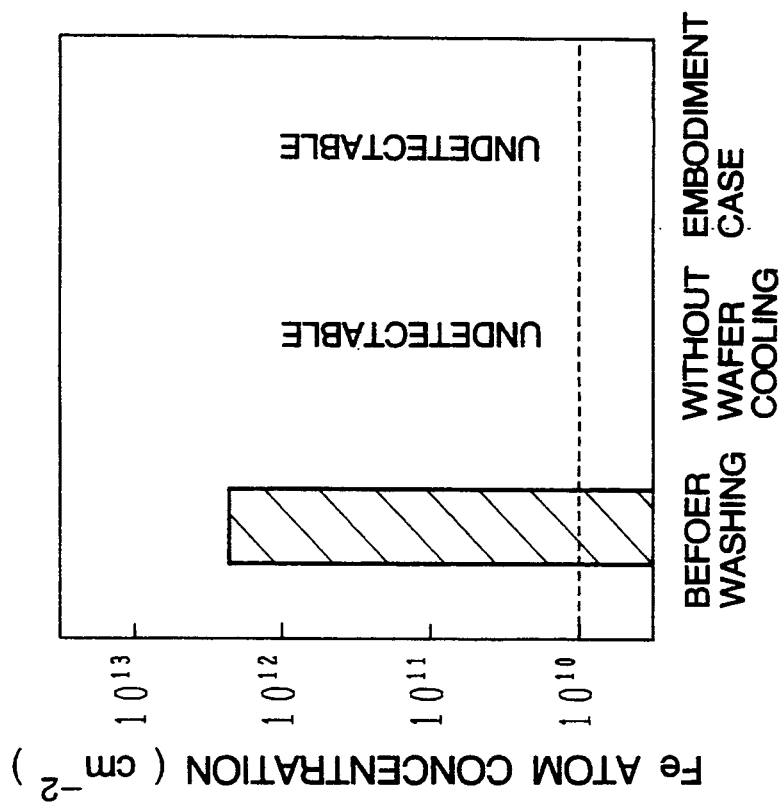

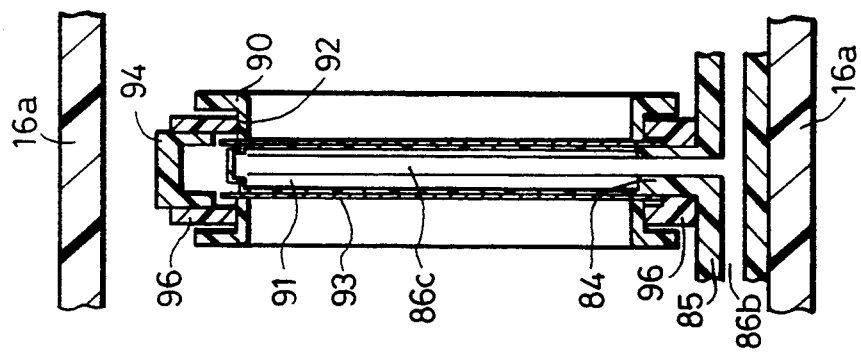
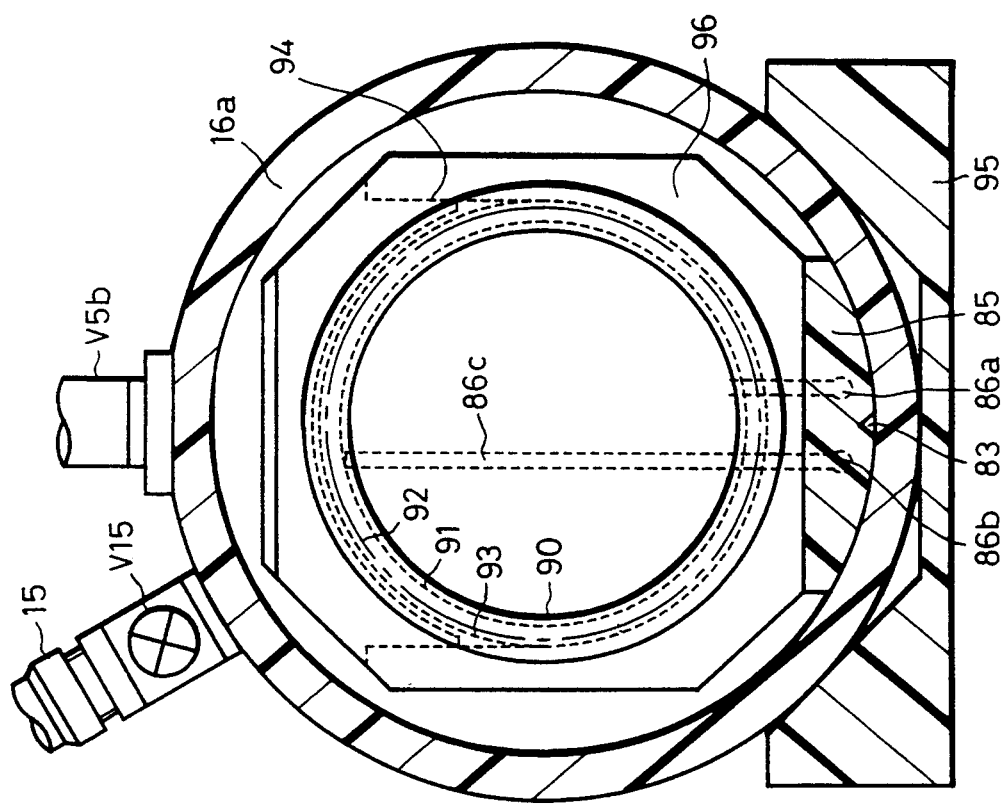
FIG.20B
FIG.20A

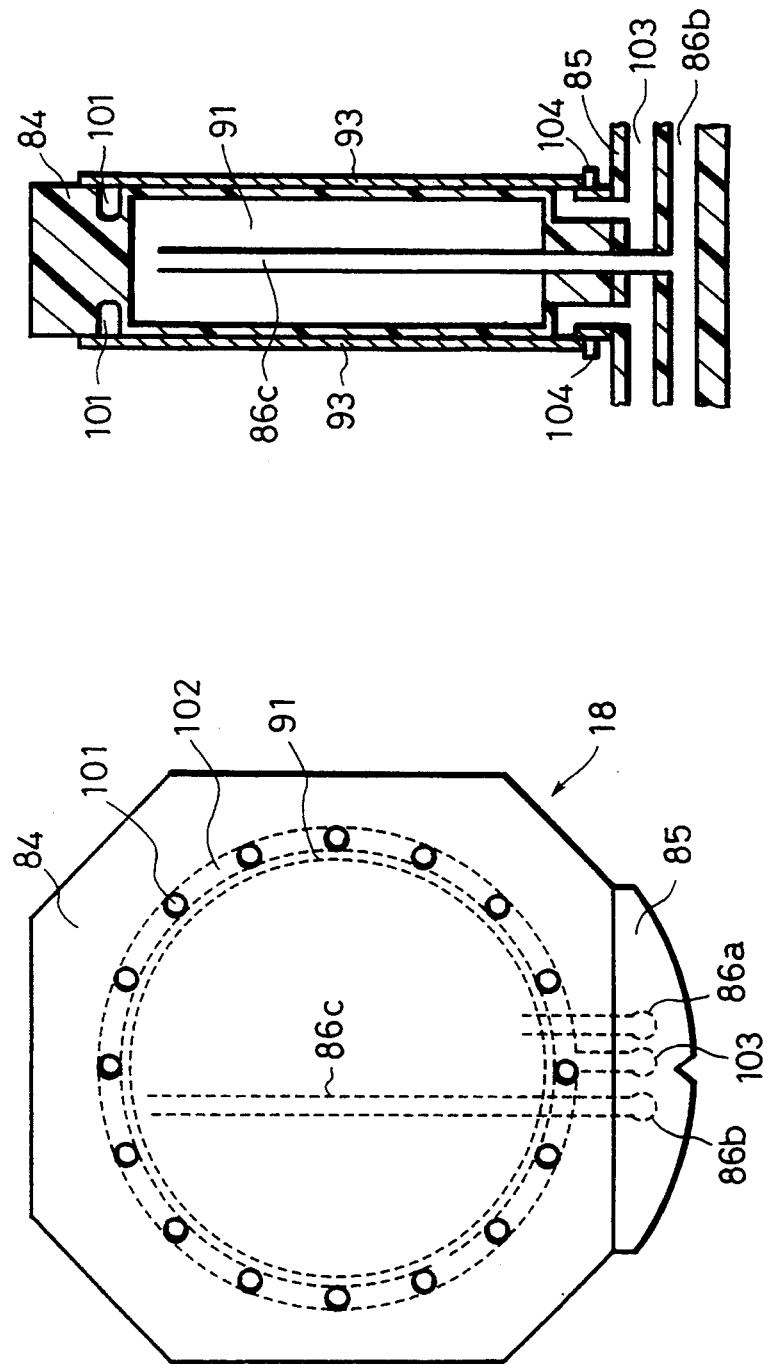

ULTRA HIGH PURITY VAPOR PHASE TREATMENT

BACKGROUND OF THE INVENTION a) Field of the Invention

The present invention relates to semiconductor wafer vapor treatment for extracting trace substance such as impurities on the surface of a specimen such as a semiconductor wafer, or etching an $SiO_2$ film on the surface of a semiconductor wafer, or cleaning the surface of a semiconductor wafer.

b) Description of the Related Art

In the field of semiconductor manufacturing, patterns of a large scale semiconductor integrated circuit are becoming very fine. Under such a situation, it is required to highly precisely control the quality of a constitutional element of a semiconductor device such as an oxide film and a nitride film. It is also required to etch an $SiO_2$ film as a constitutional element of a semiconductor device at a stable speed while maintaining the quality of the $SiO_2$ film at a high precision.

The characteristic of an insulating film of a semiconductor device is degraded if impurities are mixed in the film. The insulating property of a film is deteriorated if alkali metals or heavy metals are mixed in the film. Impurity ions drift in an insulating film under an electric field, and precipitate on interfaces or defects to thereby lower the device performance, and even the function of an integrated circuit may be lost in some cases.

A problem of impurity contamination is associated with not only an insulating film but also other various cases. In a patterning process of a semiconductor wafer, impurities attached to the surface layer of the wafer invade the inner region of semiconductor by diffusion or drift, lowering the performance of the semiconductor device. Even a very small amount of mixed impurities, which has practically made no trouble, has become significant under advanced technology.

In order to control a very small amount of impurities, it is required to have an ability of detecting such a very small amount of impurities and specify the invasion routes, influences, and the like of impurities. In extracting a very small amount of impurities mixed in an insulating film formed on a semiconductor wafer such as an oxide film and a nitride film, a high purity reagent has been used to dissolve the insulating film.

In extracting impurities by dissolving them into a purifying reagent commercially available, however, it has become difficult to obtain a sufficient sensitivity. Another method of extracting impurities at a high sensitivity has been disclosed in which vapors of purifying reagent are used.

FIGS. 26A, 26B, and 26C are cross sectional views showing the structures of typical impurity extractors using vapor phase dissolution. The impurity extractor shown in FIG. 26A uses natural evaporation of reagent disclosed, for example, in Japanese Patent Laid-open Publication No.60-69531. The impurity extractors shown in FIGS. 26B and 26C use compulsive evaporation of reagent disclosed, for example, in Japanese Patent Laid-open Publication No.60-164330 or in the preprints 2C13 of 1992 Annual Meeting of The Japan Society for Analytical Chemistry.

Referring to FIG. 26A, semiconductor wafers 122 to be tested are placed upright in a closed anticorrosion housing 121. An insulating film 123 is formed on the surface of each semiconductor wafer 122. For example, the semiconductor wafer is an Si wafer, and the insulating film 123 is an $SiO_2$ layer.

An anticorrosion reagent container 124 is placed at a different position in the housing 121, and contains high impurity liquid reagent 125 such as hydrofluoric acid. The inner surface and structure of the container 121 are made of acid resistant material such as tetrafluoroethylene. The top of the reagent container 124 is open so that the liquid reagent 125 can freely vaporize.

The housing 121 is sealed air-tight so that naturally vaporized reagent 126 is closed within the housing 121 and reaches the surface of the insulating film 123 via a perforated partition 129. As a result, the $SiO_2$ film is etched by hydrofluoric acid vapors. Impurities contained in the $SiO_2$ film are dissolved in droplets 127 of aqueous solution of hydrofluoric acid.

Since test samples are held upright, the droplets 127 fall down into a droplet reservoir 128. The impurity concentration can be known from sampled droplets by means of, for example, atomic absorption spectrometry.

With this method, the impurity concentration of the reagent vapor 126 naturally vaporized in the reagent container 124 at a room temperature is very low. Accordingly, the measurement background becomes low, enabling to measure the impurity concentration of the test sample insulating film at a high precision. According to the disclosure of the above-cited document, the concentration of Fe for example was detected at the precision of $5.5*10^{-10}$ g/$cm^2$. The measurement precision has been improved further by the advancement of technology.

This method is highly precise. However, the supply of reagent vapors is small because of natural evaporation of reagent at a room temperature. Therefore, it takes a relatively long time to extract impurities, i.e., to dissolve the $SiO_2$ film.

The method of forcibly vaporizing reagent as illustrated in FIGS. 26B and 26C has been proposed to shorten an impurity extraction time.

In the method illustrated in FIG. 26B, the vapor pressure is raised by heating reagent. Similar to FIG. 26A, a reagent container 124 and a droplet reservoir 128 are arranged in a housing 121. However, the reagent container 124 is surrounded by a heater 130 and the droplet reservoir 128 is accommodated in a cooling vessel 131.

By heating liquid reagent 125 in the reagent container 124 by the heater 130, the amount of vapors of the reagent 125 increases. The higher the heating temperature, the more the amount of generated reagent vapors. In this way, the amount of reagent vapors supplied to the surfaces of semiconductor wafers 122 can be increased.

Because the outer surface of the droplet reservoir 128 is surrounded by the cooling vessel 131, droplets moving down on the surface of the semiconductor wafers 122 and falling into the droplet reservoir 128 are cooled by the cooling vessel 131, suppressing the re-evaporation of droplets. Therefore, a change in the amount of droplets in the droplet reservoir 128 to be caused by the re-evaporation can be avoided, and in addition, it is possible to prevent droplets in different droplet vessels 128 from being mixed through the re-evaporation and re-condensation.

However, if the reagent container 124 is heated excessively, the temperature of generated reagent vapors 126 becomes high. Under such a condition, although the reagent vapors 126 react with the insulating film 123 of each semiconductor wafer 122, no droplet 127 is formed and the surface of the semiconductor wafer 122 becomes dry. In order to recover dried by-products, it is necessary to dissolve them in liquid or to recover them by other methods. Therefore, the extraction precision relies upon the purity of recovering liquid. To avoid this, the heating temperature at which the reagent 125 is vaporized is limited.

Another method has been proposed in which nitrogen ($N_2$) gas is supplied to heated reagent to blow reagent vapors to the surface of a semiconductor wafer (Technical Study Report SDM 91-159, the Institute of Electronics, Information, and Communication Engineers of Japan). With this method, reagent reacts with the surface of a semiconductor wafer without generating droplets. By-products on the wafer are recovered by flowing recovering liquid such as pure water and by dissolving them.

This method requires to use recovering liquid having a high purity, in order to obtain a sufficiently high measuring precision, even if the purity of reagent vapors blown on the surface of a semiconductor is made high.

In the method illustrated in FIG. 26C, a carrier gas such as a nitrogen gas is conveyed to two reagent containers 124a and 124b and bubbled in liquid reagents 125a and 125b to supply reagent vapors together with the carrier gas to a subject to be tested. The bubbling process increases the amount of reagent vapors and shorten an extraction time. Depending upon the kind of an insulating film 123, different reagents 125a and 125b may be used and mixed together.

With the methods illustrated in FIGS. 26A to 26C, although impurities can be extracted in a short time, the extraction precision lowers. Heating and bubbling impart high kinetic energy to generated reagent vapors so that not only reagent molecules but also mists (particles) having a diameter over 10 fm are generated. Generally, impurities such as Fe contained in the reagent are encircled by large mists and vaporized.

In other words, the evaporation of reagent through heating and bubbling may possibly loose the high purity which may otherwise be obtained by quiet natural evaporation.

Next, a conventional $SiO_2$ film etching method used by an IC manufacturing process will be described. The etching is generally performed by a wet process using hydrofluoric acid aqueous solution or a dry process using plasma. These processes are associated, however, with the problems of attachment of particles, metal impurities, and the like. A vapor phase dissolution method using a hydrofluoric acid gas has been expected as a prominent means for solving these problems. The vapor phase dissolution etching method is also effective for cleaning a semiconductor wafer because this method allows an underlie layer to be removed by using high purity etching gas and allows a clean surface to be exposed.

FIG. 27 is a schematic diagram illustrating a basic vapor phase dissolution method. Hydrofluoric acid aqueous solution 141 is contained in a container 140. A subject 142 such as an Si wafer having a $SiO_2$ film as an underlie layer is disposed near at a nozzle opening of the container 140.

As an $N_2$ carrier gas is introduced from an $N_2$ gas supplier to the container 140, a hydrofluoric acid gas and water vapors move upward to the surface of the subject 142 which is placed in a dried $N_2$ gas atmosphere.

Disclosed in J. Vac. Sci. Technol. A, Vol.7, No.3, 1989, May and June issues is the case of etching an $SiO_2$ film on the surface of an Si wafer subject 142 by heating it from 25° C. to 60° C. by changing the temperature of hydrofluoric acid aqueous solution 141 from 25° C. to 40° C. in accordance with the method illustrated in FIG. 27. According to this disclosure, the etching speed relies greatly on the temperature of the hydrofluoric acid aqueous solution 141, and rapidly lowers at the high temperature.

As the temperature of the subject 142 rises, the etching speed lowers. This may be reasoned from the temperature rise and evaporation of water acting as a catalysis on the surface of the $SiO_2$ film. This disclosure reports that the etching speed takes a maximum value at the temperature 25° C. of the hydrofluoric acid aqueous solution 141 and at the temperature of 30° C. of the subject 142.

With this $SiO_2$ film vapor phase dissolution method, the etching speed takes a maximum value at the temperature 25° C. of the hydrofluoric acid aqueous solution and at the temperature of 30° C. of the subject with an $SiO_2$ film, unable to increase the etching speed over a certain value.

A vapor phase dissolution apparatus for etching a subject by supplying a hydrofluoric acid gas, dried $N_2$ gas, and $N_2$ gas containing water contents to the subject, has been developed by Texas Institute of Technology and FSI Ltd. (merchandise name: EXCALIBUR, hydrofluoric acid anhydride gas process system).

In this apparatus, each gas flow is controlled independently to obtain an optional etching speed. The stability of the etching speed therefore depends on the control precision of gas flow.

In order to control the etching speed stably, it is necessary to highly precisely control the flow of a hydrofluoric acid gas, dried $N_2$ gas, and $N_2$ gas containing water contents. It is therefore difficult to control the etching speed stably.

Another apparatus has also been developed wherein vapors generated from hydrofluoric acid aqueous solution at a room temperature is supplied to the surface of a subject by using an $N_2$ carrier gas (merchandise name: VPV-811-A, manufactured by Dainippon Screen Mfg. Co., LTD. of Japan). In this apparatus, the density of hydrofluoric acid aqueous solution is controlled to change the etching speed. In changing the etching speed, hydrofluoric acid aqueous solution is required to be exchanged, resulting in cumbersome operations.

The above-described vapor phase dissolution method (EXCALIBUR, hydrofluoric acid anhydride gas process system) can execute a process of etching an $SiO_2$ film, a process of rinsing with pure water, and a process of drying a wafer. A semiconductor wafer can be cleaned by executing these three processes.

FIGS. 28A and 28B are bar graphs showing the concentrations of impurities on the surface of an Si wafer cleaned by using this apparatus. FIG. 28A shows the concentrations of residual Cr, and FIG. 28B shows the concentrations of residual Fe. The abscissa represents the type of samples, i.e., samples of control wafers before washing, samples after etching $SiO_2$ films, and samples after pure water rinsing and drying.

As seen from the graphs, even after the pure water rinsing and drying, Cr and Fe impurity atoms in the order of $10^{11}$ cm$^{-2}$ are resident on the surfaces of wafers. The reason for this may be the re-attachment of removed impurity atoms to the active Si surface which atoms have not been rinsed with pure water.

It is also reported that even if contaminations on the surface are dissolved by blowing hydrofluoric acid vapors to the surface of a wafer, impurity elements such as Cu cannot be recovered at the later pure water rinsing (Technical Study Report SDM 91-159, the Institute of Electronics, Information and Communication Engineers of Japan). According to this report, the reason for this is that even if Cu, and the like can be dissolved, these elements re-attach to the wafer surface because of a low ionization tendency and cannot be recovered by the later pure water rinsing and the like.

With such a conventional wafer cleaning method, dissolved metal elements re-attach to an Si surface and it is difficult to recover them completely.

SUMMARY OF THE INVENTION

It is an object of the present invention to provide a novel vapor phase treatment technique for supplying highly purified reagent gas.

It is another object of the present invention to provide a vapor phase treatment technique capable of extracting trace substance with very low background impurity concentration at a high speed and at a very high sensitivity.

It is a further object of the present invention to provide a vapor phase treatment technique capable of easily and stably controlling the speed of etching an $SiO_2$ film.

It is a still further object of the present invention to provide a vapor phase treatment technique capable of removing impurities such as metal elements dissolved by etching an $SiO_2$ film on a wafer surface, without allowing the impurities from re-attaching to the Si surface.

It is another object of the present invention to provide a vapor phase treatment apparatus for a semiconductor wafer capable of processing a plurality of semiconductor wafers at the same time.

According to one aspect of the present invention, there is provided a vapor phase treatment method comprising the steps of heating a liquid reagent and generating a reagent vapor, the reagent vapor being capable of dissolving an object to be treated, and supplying the reagent vapor to a cooled specimen, the object being formed on the surface of the cooled specimen.

After the reagent vapor generating step, the method may include a step of passing the reagent vapor through a hydrophobic porous film to intercept a mist having a diameter greater than a predetermined value and highly purify the reagent vapor.

The method may include a step of mixing the reagent vapor with an inert gas.

The method may include a step of adjusting the etching speed to a predetermined value by controlling the heating temperature for the liquid reagent and the amount of mixed inert gas.

The liquid reagent may be a hydrofluoric acid aqueous solution, and the object may be a silicon oxide.

By heating and vaporizing a reagent, the amount of reagent vapors is increased. By supplying the reagent vapors to the cooled object, the by-products of the reaction with the object can be obtained as droplets. Reagent vapors contain large diameter mists and its purity is low. However, by passing the reagent vapors through a hydrophobic porous film, mists having a diameter greater than a predetermined value can be intercepted, improving the purity of reagent vapors.

By supplying the high purity reagent vapors obtained in the above manner to the cooled object, the by-products of the reaction with the object can be obtained as droplets.

From the recovered droplets, trace substance can be extracted without being affected by environmental contamination.

The amount of reagent vapors supplied to an object can be regulated by controlling the temperature of liquid reagent. It is therefore possible to stably control the amount of etching gas and to stably control the etching speed.

By cooling the object, the temperature of hydrofluoric aqueous solution can be raised and the etching speed can be increased. This is conceivable from that the chemical reaction of dissolving $SiO_2$ is promoted by the presence of smoggy water on the $SiO_2$ film surface which acts as a catalysis.

According to another aspect of the present invention, there is provided a vapor phase treatment apparatus comprising heating means for heating a container for accommodating a liquid reagent, cooling means for cooling an object to be treated and placed on the cooling means, and a gas supply system for communicating the opening of the container to the upper area of the cooling means and supplying a reagent vapor generated in the container to the object.

It is preferable to use a filter member including a hydrophobic porous film and being capable of covering the opening of the container.

The apparatus may include means for holding the object placed on the cooling means, and a mechanism for exposing a predetermined area of the object.

The apparatus may include a nozzle for blowing a high purity inert gas to the object, and a reaction unit for accommodating the cooling means and the nozzle.

The apparatus may include means for supplying a nitrogen vapor generated from a liquid nitrogen to the nozzle.

The nitrogen gas supplying means may include a nitrogen gas purifying unit, a pressure reducing valve, a flow rate valve, and a nitrogen gas filter.

The cooling means may have a flat surface for holding the object horizontally, vertically, or obliquely.

The apparatus may include means for moving the nozzle along the surface of the object.

The nozzle may include a plurality of outlets for blowing an inert gas to the whole surfaces of the objects at the same time.

By heating and vaporizing a reagent, the amount of reagent vapors is increased. By supplying the reagent vapors to the cooled object, the by-products of the reaction with the object can be obtained as droplets.

Reagent vapors contain large diameter mists and its purity is low. However, by passing the reagent vapors through a hydrophobic porous film, mists having a diameter greater than a predetermined value can be intercepted, improving the purity of reagent vapors.

A high purity inert gas is blown to fine droplets on the surface of an object to roll the droplets and collect them to form a single large diameter droplet. Accordingly, only the droplets on the object surface can be recovered in a short time and at a high purity.

As described above, trace substance can be extracted at a high speed and at a high precision.

The vapor phase treatment apparatus may include rinsing/drying means for rinsing and drying the object.

The apparatus may include a rinsing/drying vessel partitioned from the reaction unit by a shutter for accommodating the ringing/drying means.

The rinsing/drying means may include pure water introducing means mounted above the object, and a spinner for fixing the object and rotating the object.

The rinsing/drying means may include first gas introducing means for introducing a dried inert gas into a space where the object is placed, and first gas draining means for draining the gas from the space.

The apparatus may include an object transporter for transporting the object placed on the cooling means to the rinsing/drying vessel.

By cooling the object when etching an $SiO_2$ film on the surface of the object, fine droplets attach to the object surface.

Impurity atoms in the $SiO_2$ film dissolved by hydrofluoric acid vapors are contained in the droplets. Before the impurity atoms re-combine with the active object surface, the droplets are washed out to thereby effectively remove the impurity atoms.

By passing heated hydrofluoric acid vapors through the hydrophobic porous film, high purity hydrofluoric acid vapors can be supplied to the object, preventing the object from being contaminated by the impurities in the hydrofluoric acid vapors.

As described above, a semiconductor wafer can be cleaned to ultra high purity.

The vapor phase treatment apparatus may include a reaction unit for accommodating the cooling means and the cooling means may include at least two cooling vessels for cooling the object placed on the cooling means.

The cooling means may include a cooling vessel support for supporting the at least two cooling vessels spaced apart by a predetermined distance.

The vapor phase treatment apparatus may be structured such that a space is formed in the cooling vessel for circulating cooled water, a cooled water supply path for supplying the cooled water to the space and a cooled water drain path for draining the cooled water from the space are formed in the cooling vessel support, the apparatus may further include cooled water introducing means for introducing the cooled water from the outside of the reaction unit to the cooled water supply path and cooled water draining means for draining the cooled water from the cooled water drain path to the outside of the reaction unit.

The cooling vessel may be provided with vacuum holding means for tightly fixing the object to the surface of the vacuum holding means through vacuum suction.

The apparatus may be structured such that a vacuum suction path is formed in the cooling vessel support, the vacuum suction path being communicating with the vacuum holding means and vacuum-sucking the inside of the vacuum holding means, and the apparatus may further include vacuum suction means for vacuum-sucking the inside of the vacuum suction path to guide sucked air to the outside of the reaction unit.

The apparatus may include a shower nozzle for jetting out pure water to the object accommodated in the reaction unit.

The apparatus may include a jet nozzle for blowing out droplets attached to the surface of the object accommodated in the reaction unit and for drying the object.

A plurality of cooling vessels can be accommodated in the reaction unit so that a plurality of specimens can be dissolved in a vapor phase at the same time. Accordingly, the productivity can be improved for the extraction of trace substance, the cleaning of a specimen surface, and the etching of an object.

In cleaning or etching the surface of a specimen, the specimen is fixedly attached to each cooling vessel through vacuum suction, thereby allowing to expose the whole surface to reagent vapors. Accordingly, the whole surface can be cleaned or etched efficiently. After the vapor phase dissolution, each specimen surface can be rinsed at the same time in the reaction unit and thereafter dried by blowing an inert gas, preventing the re-attachment of impurities to the specimen surface.

The vapor phase treatment apparatus may include another filter member including a hydrophobic porous film and being capable of covering the opening of another container accommodating another liquid reagent, another heating means for heating the other container, and another gas supply system for communicating the opening of the other container to the upper area of the cooling means and supplying the reagent vapor generated in the other container to the object.

A plurality of purified reagent gas generators are provided to allow the use of a different type of reagent vapors. For example, by using hydrofluoric acid vapors and hydrochloric acid vapors for the dissolution of an $SiO_2$ film, metal impurities can be efficiently removed.

BRIEF DESCRIPTION OF THE DRAWINGS

FIGS. 11A and 11B are a front view and sectional view showing the cooling vessel, specimen, and nozzle in which the specimen is placed upright, according to a modification of the second embodiment.

FIG. 16A is a graph showing Fe atom concentrations on wafer surfaces before and after cleaning, according to the fourth embodiment.

FIG. 16B is a graph showing Cu atom concentrations on wafer surfaces before and after cleaning, according to the fourth embodiment.

FIG. 20A is a cross sectional view showing the reaction unit and specimen holder according to the fifth embodiment.

FIG. 20B is a partial cross sectional view of the specimen holder according to the fifth embodiment.

FIG. 23A is a side view of the specimen holder according to a sixth embodiment of the present invention.

FIG. 23B is a partial cross sectional view of the specimen holder according to the sixth embodiment.

DETAILED DESCRIPTION OF THE PREFERRED EMBODIMENTS

Figure 1:
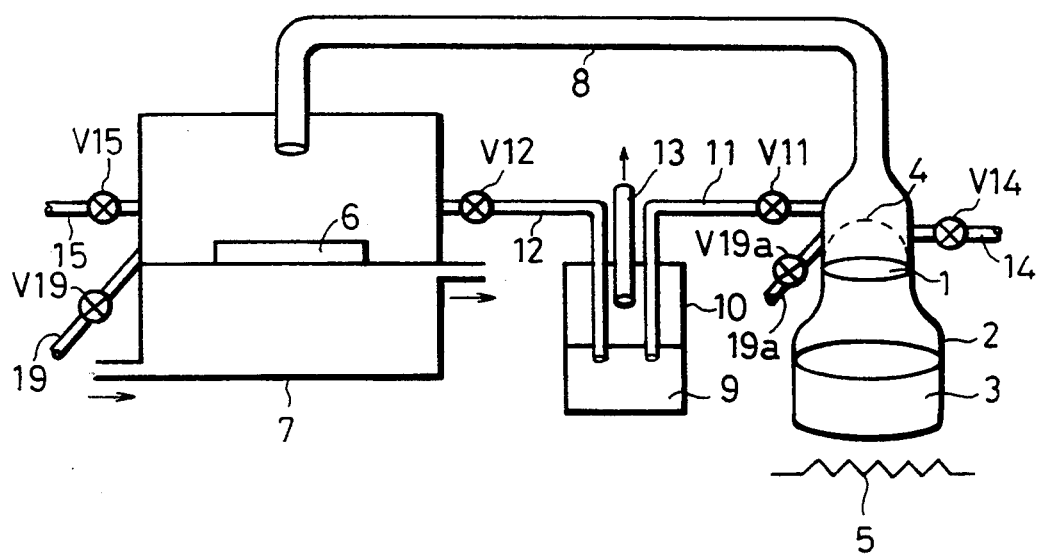
FIG. 1 is a schematic diagram showing the fundamental structure of a trace substance extracting apparatus according to a first embodiment of the present invention.

FIG. 1 shows the fundamental structure of a trace substance extracting apparatus according to the first embodiment of the present invention. The apparatus has as its main units a ultra high purity gas generator, and a vapor phase dissolution unit for reacting a specimen 6 housed in this unit with purified vapors to extract trace substance contained in the specimen.

Referring to FIG. 1, a container 2 having an opening 1 contains liquid reagent 3. A hydrophobic porous film 4 is disposed covering the opening 1. A heating means 5 is provided near the container 2 to heat the inside of the container 2. The reagent 3 in the container 2 is heated to increase the amount of reagent vapors.

The generated reagent vapors are supplied via the hydrophobic porous film 4 to a gas supply system 8. When reagent vapors pass through the hydrophobic porous film 4, mists having a larger particle diameter contained in the reagent vapors are intercepted and captured.

Heated impurities in the reagent 3 are vaporized by being encircled by mists having a larger particle diameter. But, they are intercepted by the hydrophobic porous film 4 and will not reach the gas supply system. Accordingly, the reagent vapors supplied via the hydrophobic porous film 4 to the gas supply system have a high purity. The hydrophobic porous film 4 is not necessary to cover the whole area of the opening, but a filter member having a hydrophobic porous film may be used for covering the opening 1.

Another purified gas generator including another container like the container 2, another filter member including a hydrophobic porous film like the hydrophobic porous film 4, and another heater like the heater 5, may be connected to the gas supply system 8.

By connecting a plurality of purified gas generators to the gas supply system, the vapor phase dissolution can be continuously performed by exchanging the purified gas generator if the amount of reagent of one purified gas generator becomes small. A purified gas generator having a different type of reagent may be connected to the vapor phase dissolving unit via a different gas supply system.

In the vapor phase dissolving unit on the left side of FIG. 1, the specimen 6 is placed on a cooling vessel 7. The space encircling the specimen 6 is communicating with the gas supply system 8 and is made generally of an air tight structure.

The reagent vapors supplied from the gas supply system 8 are transported to the surface of the specimen 6 to react with it and produce by-products. Since the specimen 6 has been cooled by the cooling vessel, the reagent vapors are liquidized on the surface of the specimen 6, generating droplets.

The cooling vessel 7 is maintained at a temperature lower than the room temperature, by flowing, for example, cooled water through the cooling vessel 7. Medium other than cooled water may be used so long as it can cool the specimen 6.

The vapor phase dissolving unit is connected to an exhaust system having a valve V12 and a pipe 12. Reagent vapors and the like after reacted with the specimen 6 are guided via the pipe 12 to an exhaust gas processing vessel 10 whereat they are bubbled in an exhaust gas processing liquid 9.

If reagent such as acid reagent is used, an alkaline solution is used as the exhaust gas processing liquid 9 to neutralize the acid reagent by bubbling it. The exhaust gas processed in this manner is not hazardous and is exhausted via a pipe 13.

On the side of the container 2 containing the reagent 3, the gas supply system 8 is connected via valves V11 and V14 to a pipe 11 and gas introducing means 14. The pipe 11 is dipped in the exhaust gas processing liquid 9 in the exhaust gas processing vessel 10. If the reagent gas is guided to this pipe 11, it is bubbled in the exhaust gas processing liquid 9.

A carrier gas such as an inert gas can be guided via the gas introducing means 14. While the reagent 3 in the container 2 is heated and vaporized, the carrier gas is introduced from the gas introducing means 14, to supply reagent vapors of a desired concentration to the vapor phase dissolving unit.

The gas supply system 8 as well as the container 2 is preferably maintained at a desired temperature. In this manner, the reagent vapors generated by heating them by the heating means 5 can be supplied via the gas supply system to the vapor phase dissolving unit without liquidizing them.

Also on the side of the vapor phase dissolving unit, in addition to the pipe 12, a gas introducing means 15 is connected via a valve V15. This gas introducing means 15 is used for guiding a gas such as an inert gas to the vapor phase dissolving unit to purge the inner space of the vapor phase dissolving unit.

It is preferable to provide liquid drains 19 and 19a having valves V19 and V19a communicating with the vapor phase dissolving unit above the surface of the cooling vessel 7 and with the container 2 above the surface of the hydrophobic porous film 4 to drain liquids formed on the surfaces.

In extracting trace substance from the specimen 6, preferably the gas supply system 8 is first closed by using a valve or the like (not shown), and then the valve V11 is opened to guide reagent vapors to the exhaust gas processing vessel 10 until a steady state can be achieved. After the steady state is achieved, the reagent vapors are supplied via the gas supply system 8 to the vapor phase dissolving unit for a predetermined time.

Figure 2:
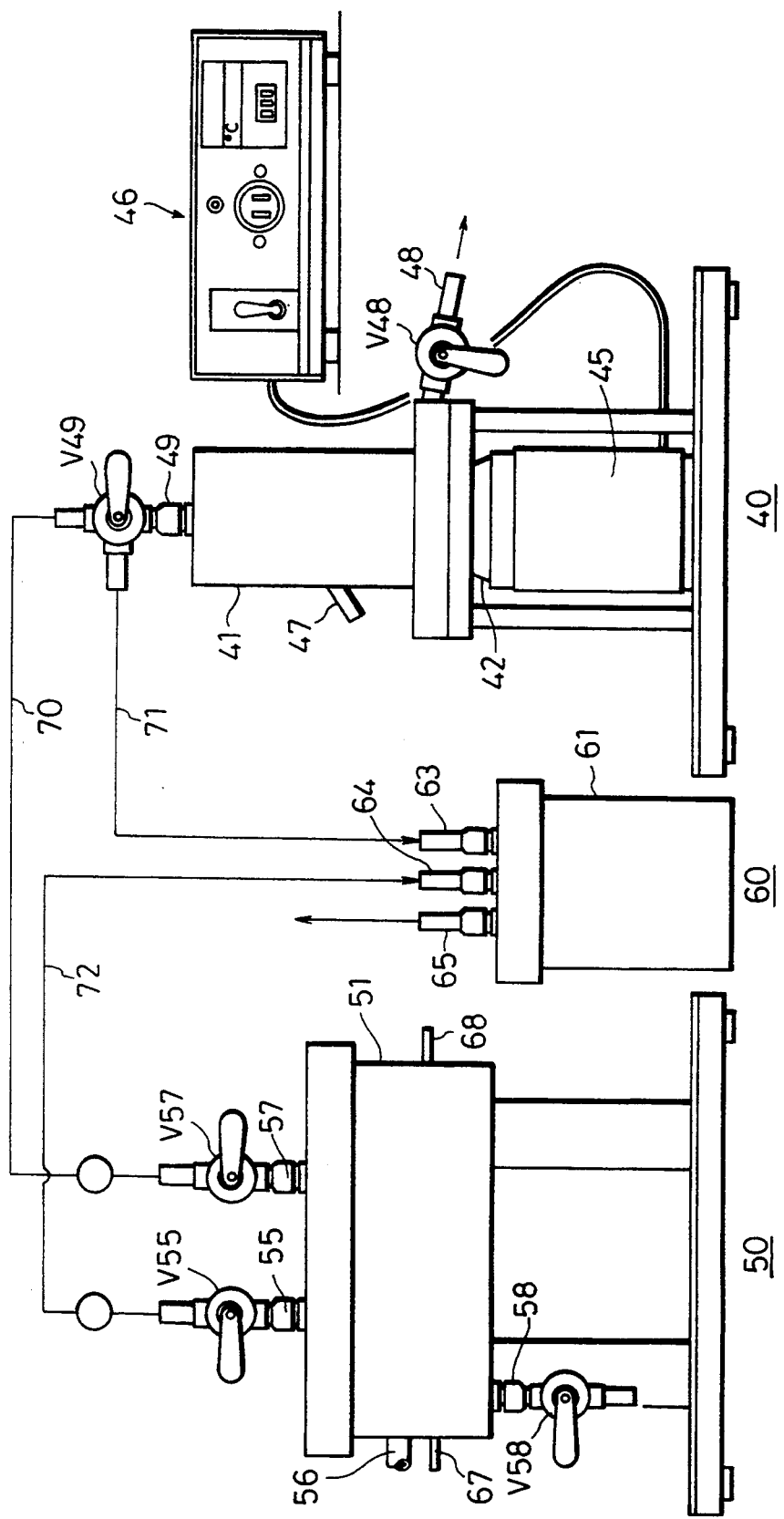
FIG. 2 is a schematic side view of the impurity extracting apparatus of the first embodiment of the invention.

FIG. 2 shows the apparatus of extracting impurities on the surface of a semiconductor according to the first embodiment of the invention. The impurity extracting apparatus includes as its main units a purified gas generator 40, a vapor phase dissolving unit 50, and an exhaust gas processing unit 60. Impurities to be extracted are impurities contained in an insulating film formed on the surface of a semiconductor wafer.

In the purified gas generator unit 40, a reagent container 42 such as available in markets is placed on a base with its lid being removed, and another container 41 is fitted in the opening of the reagent container 42. A rubber heater 45 is wound about the reagent container 42 to heat the container to a predetermined temperature. The rubber heater 45 is connected to a temperature controller 46 to maintain the predetermined temperature.

Until the nitric acid aqueous solution had been heated, similar to the above-described embodiment, generated reagent vapors and nitrogen carrier gas were introduced via the exhaust gas outlet 49b and gas pipe 71 to the exhaust gas processing unit 60 by operating the three-way valve V49.

After the temperature of the reagent 43 became stable, the three-way valve V49 was operated to introduce the nitric acid aqueous solution and nitrogen carrier gas to the vapor phase dissolving unit 50 via the gas outlet 49c and gas pipe 70.

After the lapse of five minutes, the three-way valve V49 was again operated to switch the gas passage from the exhaust gas outlet 49b to the exhaust gas processing unit At the same time, the two-way valve V55 was closed and the two-way valve V56 was opened to purge the residual gas in the housing 51 of the vapor phase dissolving unit 50 by the nitrogen gas.

Thereafter, the vapor phase dissolving unit 50 was opened to pick up droplets of nitric acid aqueous solution formed on the surface of the Si wafer by a micro pipet. $SiO_2$ is stable with respect to the nitric acid solution. Therefore, the Si wafer did not dissolved and only the particles on the wafer were dissolved in the form of droplets.

The temperature controller 46 can set an optional temperature depending upon the type and condition of reagent. The container 41 is provided with gas pipes 47 and 49 and a drain 48. The drain 48 and gas pipe 49 have valves V48 and V49, respectively. The gas pipe 47 is connected via a valve (not shown) to an inert gas source.

With the purified gas generator constructed above, the reagent in the reagent container 42 is heated to the predetermined temperature, and the generated reagent vapors are purified and supplied via the gas pipe 49 and valve V49 to a gas pipe 70 or 71.

In the vapor phase dissolving unit 50, semiconductor wafers from which impurities are to be extracted are disposed in a housing 51. The housing 51 is connected to gas pipes 55, 56, and 57 and to a drain 58.

The gas pipes 55 and 57 and the drain 58 have valves V55, V57, and V58, respectively. The gas pipe 56 is connected via a valve (not shown) to an inert gas source. In the embodiment shown in FIG. 2, a gas pipe 70 interconnects the valve V49 of the purified gas generator 40 and the valve V57 of the vapor phase dissolving unit The container 41 and housing 51 themselves or at least the inner surfaces thereof are made of material not invaded by the reagent, such as tetrafluoroethylene. The gas pipe 70 is made of a free tube such as flexible tetrafluoroethylene.

The exhaust gas processing unit 60 has a vessel 61 formed with gas inlets 63 and 64 and a gas outlet 65. The gas inlets 63 and 64 are connected via free tubes 71 and 72 such as tetrafluoroethylene to valves V49 and V55, respectively. After and before the dissolution of a specimen, the valve V49 is opened to the gas pipe 71 to process generated reagent vapors in the exhaust gas processing unit After the dissolution of a specimen, the valve V57 is closed and the valve V55 is opened to supply the inert gas via the gas pipe 56 to purge the inner space of the housing 51 of the vapor phase dissolving unit The housing 51 of the vapor phase dissolving unit 50 has a cooled water inlet 67 and a cooled water outlet 68. The drains 48 and 58 are used for the drainage of liquid formed in the container 41 and housing 51. The details of components of the impurity extracting apparatus will be described with reference to the accompanying drawings.

Figure 3:
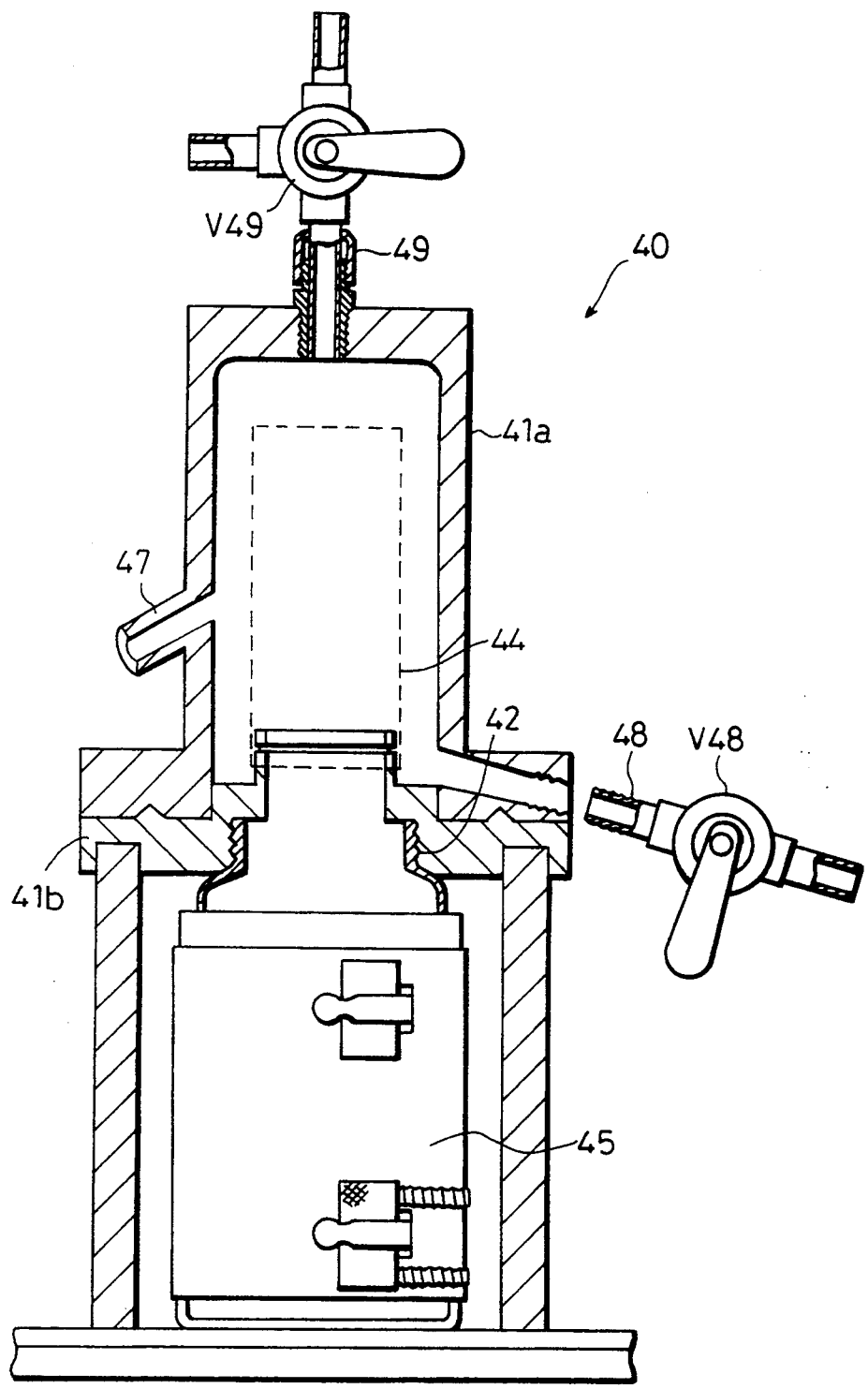
FIG. 3 is a side view partially in section showing the purified gas generator of the impurity extracting apparatus shown in FIG. 2.

FIG. 3 shows the structure of the purified gas generator. The reagent container 42 may be a reagent container available in markets or a container used for accommodating reagent taken out from a reagent container available in markets. The reagent container 42 has threads formed on the outer surface of the neck near the opening. The rubber heater 45 is wound about the reagent container 42 to uniformly heat the whole of the container to a predetermined temperature.

A lower plate 41b meshes with the thread of the reagent container 42. An upper plate 41b engages with the lower plate 41b to form an inner space of an air tight structure. A hydrophobic porous film 44 made of tetrafluoroetylene is coupled to the lower plate 41b so that vapors generated in the reagent container 42 will pass through the hydrophobic porous film 44 to move above the film 44.

The upper plate 41b housing the hydrophobic porous film 44 is provided with the gas pipes 47 and 49 and the drain 48. The drain 48 is used for the drainage of reagent vapors liquidized after passing through the hydrophobic porous film 44.

The gas pipe 47 is used for introducing the carrier gas. The gas pipe 49 is used for guiding generated reagent vapors and the carrier gas to the outside of the container 41. A three-way valve V49 is connected to the gas pipe 49.

A two-way valve may be connected to the gas pipe 47. The container 41 and the pipe for transporting the purified gas are heated by a rubber heater or a ribbon heater.

Figure 4:
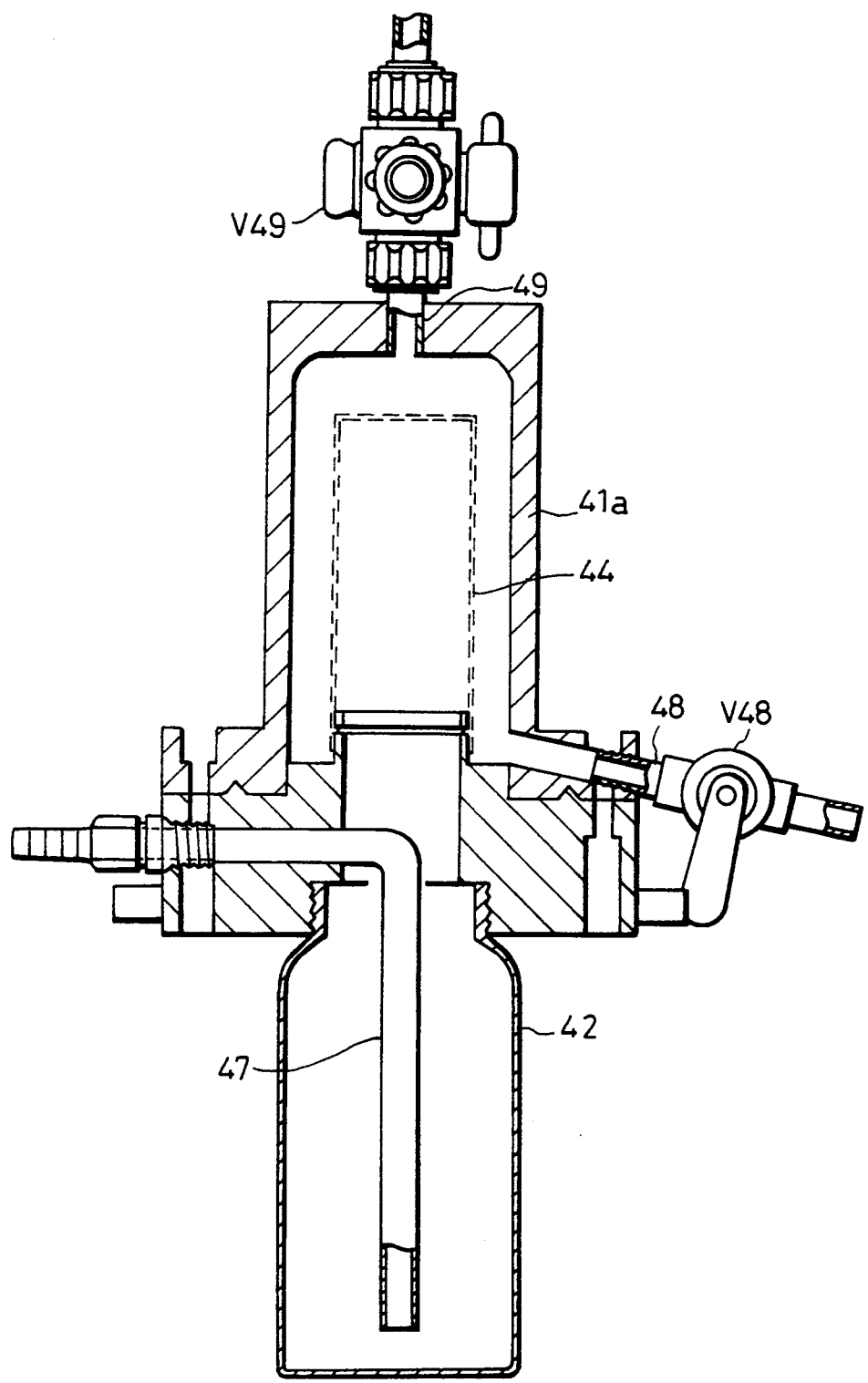
FIG. 4 is a side view partially in section showing another example of the purified gas generator of the impurity extracting apparatus shown in FIG. 2.

FIG. 4 shows the structure of another purified gas generator. A gas pipe 47 is inserted deeply into the reagent container 42. A hydrophobic porous film 44 coupled to a lower plate 41b is made of two films each having holes of a different diameter. The inert gas such as a nitrogen gas and argon gas supplied from the gas pipe 47 is bubbled in the reagent of the reagent container 42. The inert gas with reagent vapors passes through the hydrophobic porous film 44 and is transported via a gas pipe 49. The other components are the same as those used with the purified gas generator shown in FIG. 3.

Figure 5:
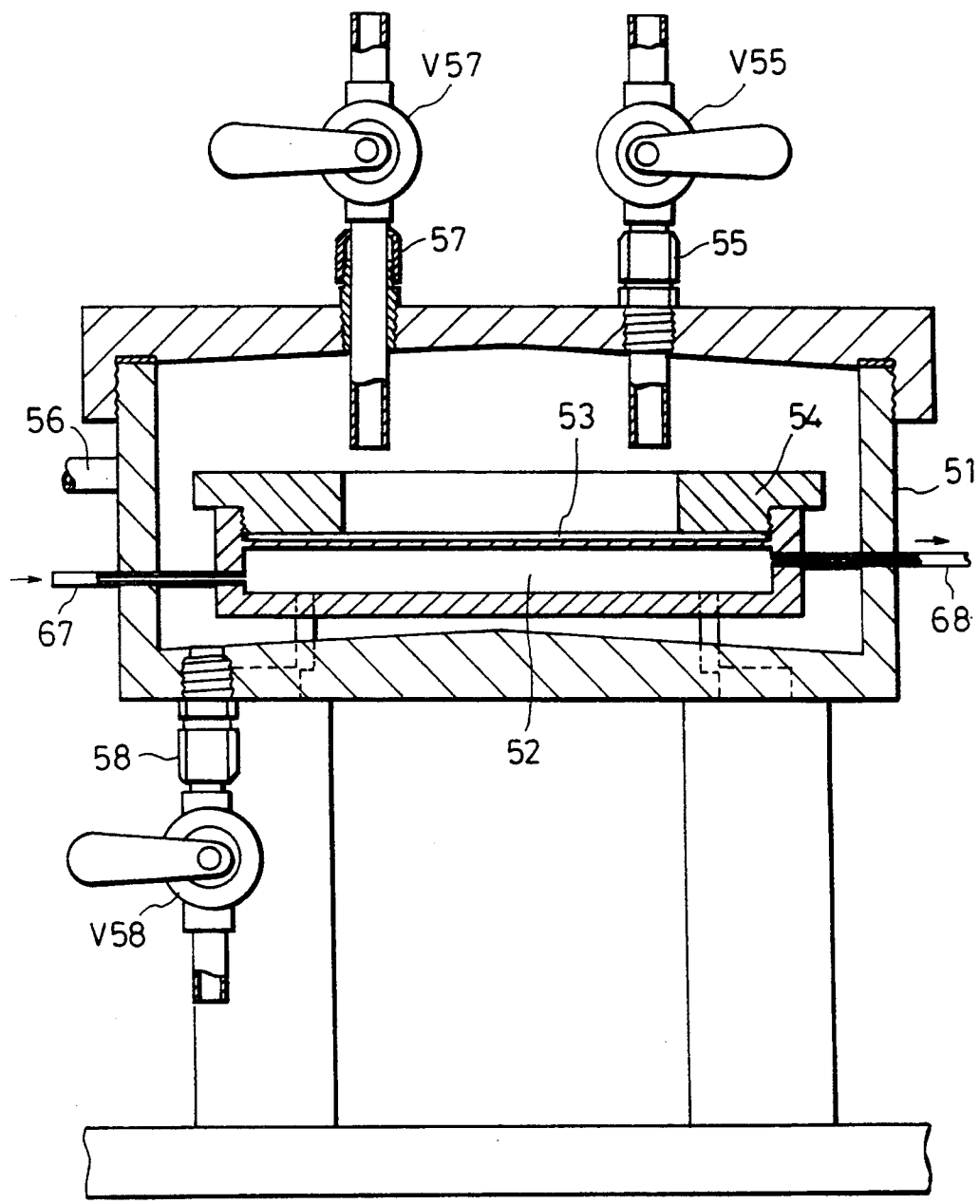
FIG. 5 is a side view partially in section showing the vapor phase dissolving unit of the impurity extracting apparatus shown in FIG. 2.

FIG. 5 shows the structure of the vapor phase dissolving unit 50. The housing 51 has a cooling vessel 52 in which cooled water flows. The cooling vessel 52 has an upper plate made of a tetrafluoroetylene sheet on which a specimen is placed, and the cooled water inlet 67 and outlet 68. A semiconductor wafer 53 is placed on the upper plate made of the tetrafluoroethylene sheet of the cooling vessel 52. A specimen pusher 54 is mounted on the semiconductor wafer 53 while exposing a predetermined area of the wafer.

The housing 51 is connected to the gas pipes 55, 56, and 57 and the drain 58. The gas pipes 55 and 57 are provided with the two-way valves V55 and V57, respectively. The drain 58 is provided with the two-way valve V58.

The gas pipes 55 and 57 are used as a reagent gas inlet pipe and a reagent gas outlet pipe. The gas pipe 56 is used for introducing a purge gas after the dissolution of a specimen. A two-way valve may be provided for the gas pipe 56.

In the impurity extracting apparatus described above, the surface of the components in contact with liquid reagent or vaporized reagent is preferably made of anticorrosion material such as tetrafluoroethylene and acid resistant polyethylene.

The rubber heater wound about the reagent container 42 is used for heating reagent. Other heating methods may be used. For example, a reagent container is placed in an air tight housing and heated from the bottom of the housing. The whole part of the reagent container may be heated.

It is desired that reagent vapors vaporized from the liquid reagent are not liquidized until they contact the specimen.

The exhaust gas processing unit 60 neutralize reagent such as acid to make it not hazardous. For example, alkaline aqueous solution is used for acid reagent and the exhaust gas is bubbled in this solution and drained.

The anticorrosion hydrophobic porous film of the purified gas generator is made of, for example, a tetrafluoroetylene film having a number of small holes of 10 to 100 $\mu$m. This film may be a single layer or a multilayer, and may take any desired shape.

As well known, the hydrophobic porous film passes vapors of fine reagent particles and the carrier gas, but intercepts mists of large particles containing impurity atoms.

Therefore, reagent vapors of a high concentration generated by heating liquid reagent and transported by the carrier gas after bubbling, have a high purity like natural evaporation after passing through the hydrophobic porous film.

Even if the heated reagent gas of a ultra high purity contacts the surface of a specimen, it is cooled by the surface of the specimen cooled by the cooling vessel, and generates droplets. Since the temperature of droplets is low, the specimen surface is prevented from being etched excessively.

Figure 6:
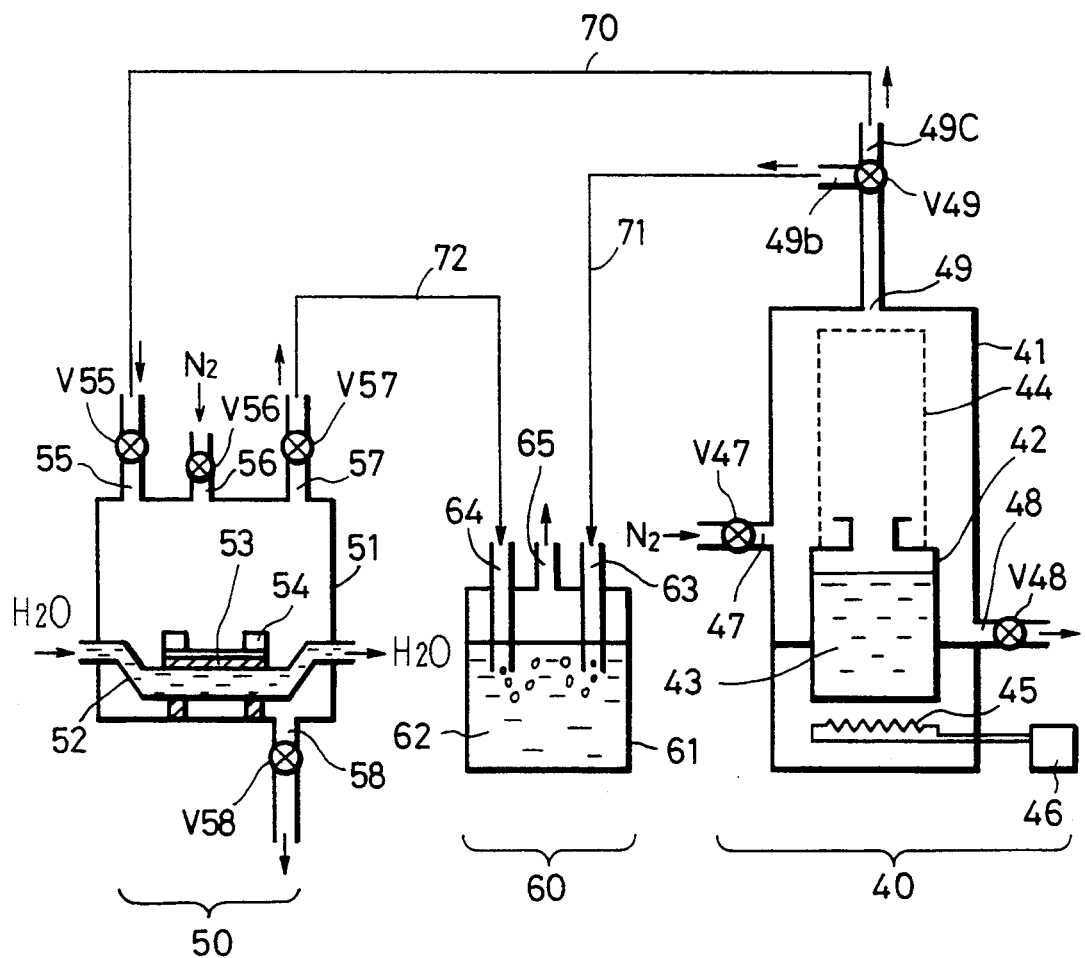
FIG. 6 is a schematic cross sectional view explaining the function of the embodiment shown in FIGS. 2 to 5.

FIG. 6 is a cross sectional view explaining the function of the first embodiment.

The extracting apparatus has the purified gas generator 40, vapor phase dissolving unit 50, exhaust gas processing unit 60, and gas pipes 70, 71, and 72.

The purified gas generator 40 has the anticorrosion container 41 housed in which are the reagent container 42 and the tetrafluoroethylene porous film 44 of a cylindrical shape covering the container opening. The reagent container 42 is made of tetrafluoroethylene and accommodates liquid reagent 43.

A heater 45 is provided for the reagent container 42, and controlled by a temperature controller 46 to maintain a predetermined temperature. The heater 45 may be any type of heaters so long as the temperature can be regulated.

The container 41 has the gas pipe 47 for introducing a carrier gas such as a ultra high purity nitrogen or argon, the gas pipe 49, and the drain 48. The valves V47, V49, and V48 made of tetrafluoroethylene are provided for the gas pipes 47 and 49 and the drain 48.

The valve V49 guides the gas from the container 41 to the exhaust has processing unit 60 or to the vapor phase dissolving unit 50. In place of the three-way valve, two two-way valves may be used.

The vapor phase dissolving unit 50 has the anticorrosion housing 51 in which the cooling vessel 52 and the specimen pusher 54 are disposed.

The housing 51 has the gas pipe 56 with the valve V56 for introducing a purge gas such as ultra high purity nitrogen or argon, the gas pipe 55 with the valve V55 for the reagent gas, the exhaust gas pipe 57 with the valve V57, and the drain with the two-way valve V58. Cooled water flows in the cooling vessel 52 to cool a specimen via the upper plate.

The exhaust gas processing unit 60 has the anticorrosion vessel 61 made of vinyl chloride in which processing liquid 62 is accommodated, the exhaust gas inlets 63 and 64, and the gas outlet 65. As shown in FIG. 6, the exhaust gas inlets 63 and 64 are connected to the pipes inserted deeply into the vessel 61 to bubble the exhaust gas in the processing liquid 62.

Figure 7A:
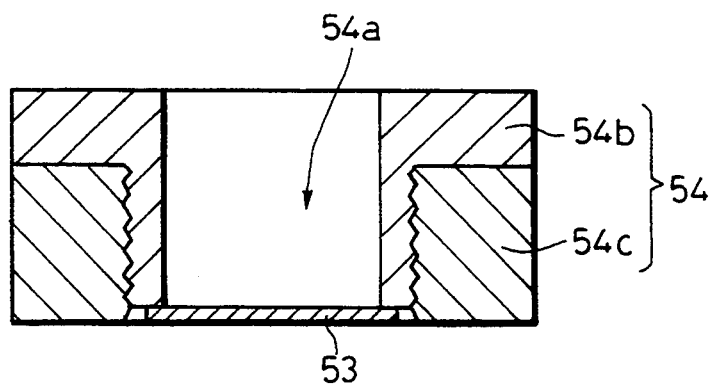
FIG. 7A is a schematic cross sectional view of the specimen pusher of the first embodiment shown in FIGS. 2 to 5.

FIG. 7A is a cross sectional view showing the structure of the specimen pusher 54. The specimen pusher 54 is formed by a threaded section 54b made of tetrafluoroethylene and a fixed base section 54c made of tetrafluoroethylene. The threaded section 54b has an opening 54a of a predetermined size at the central area thereof.

The opening is a through hole as shown in FIG. 7A reaching the surface of the specimen (semiconductor wafer) 53 placed on the cooling vessel 52 at the bottom of the fixed section 54c. The purified reagent gas contacts the specimen 53 at the opening and reacts with it.

Figure 7B:
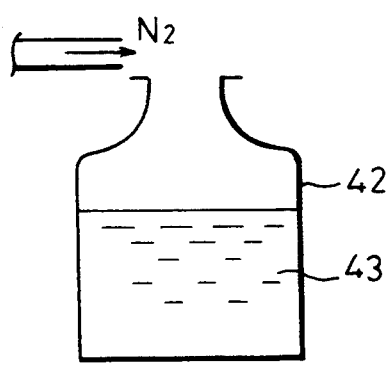
FIGS. 7B and 7C are schematic cross sectional views explaining the carrier gas introducing method of the first embodiment shown in FIGS. 2 to 5.
Figure 7C:
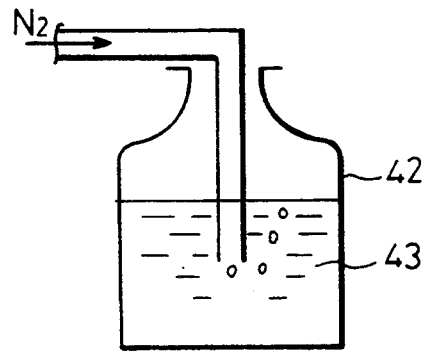

FIGS. 7B and 7C illustrate how the carrier gas is introduced to the purified gas generator 40. FIG. 7B illustrates that vapors of the reagent 43 generated by heating them are mixed by nitrogen gas at the outside of the reagent container 42 and transported by the nitrogen gas.

FIG. 7C illustrates that nitrogen gas is bubbled in the reagent 43 accommodated in the reagent container 42 to forcibly generate reagent vapors and transport them. Either one of the two methods may be used. Nitrogen gas may be flown to the surface of the liquid reagent 43. The gas pipe 70 and the upper area of the container 51 are heated to take a predetermined temperature, for example, by a ribbon heater (not shown).

Extracting and analyzing impurities in an oxide film formed on an Si wafer will be described with referent to FIG. 6. A specimen 53 having an $SiO_2$ film of 1000 angstroms formed on an Si wafer by thermal oxidization was placed on the cooling vessel 52 and held in position by the pusher 54.

Cooled water was flown in the cooling vessel 52. After heating the gas pipe 70 and the upper area of the container 51, nitrogen gas was introduced via the two-way valve V47 into the container 41. In this case, for example, hydrofluoric acid of 50 weight % was used as the reagent 43. The valve V56 was opened to introduce nitrogen gas into the container 51.

In this gas substitution process, the heater 45 was maintained turned off. The three-way valve V49 was opened to the exhaust gas processing unit 60. The two-way valve V57 was opened to introduce gas in the container 51 into the exhaust gas processing unit 60.

Caustic soda solution was accommodated in the exhaust gas processing unit 60. For the gas substitution of the gas pipe 70, the two-way valve V55 was opened to flow the nitrogen gas in the opposite direction to introduce it via the three-way valve V49 to the exhaust gas processing unit 60.

After the gas substitution, the heater 45 was turned on to raise the temperature to 80° C. During this period, hydrofluoric acid vapors were flown to the exhaust gas processing unit 60.

When the temperature of the heater 45 became stable, the three-way valve V49 was opened to introduce generated hydrofluoric acid vapors and nitrogen carrier gas to the vapor phase dissolving unit 50 via the valve V49 and gas pipe In this case, the two-way valves V55 and V57 were opened and the two-way valves V56 and V58 were closed.

Of the hydrofluoric acid vapors, mists having the diameter of ten and several $\mu$m to several tens $\mu$m were removed when the vapors passed through the tetrafluoroethylene porous film 44. Therefore, hydrofluoric acid vapors of a ultra high purity were supplied to the surface of the specimen 53. After supplying the reagent gas for ten minutes, the three-way valve V49 was operated to introduce the hydrofluoric acid vapors to the exhaust gas processing unit 60. At the same time, the two-way valve V55 was closed.

Next, the two-way valve V56 was opened to introduce nitrogen gas into the housing 51 to purge the residual gas to the exhaust gas processing unit 60 via the exhaust gas pipe 57 and gas pipe 72.

Thereafter, the two-way valves V56 and V57 were closed and the housing 51 was opened. Droplets formed on the surface of the specimen 58 were picked up by a micro piper.

It was found by an ellipsometer that the $SiO_2$ film was completely etched off from the Si wafer. The time during which the reagent gas was introduced to the vapor phase dissolving unit 50 was changed to check the etching state of the $SiO_2$ film. It was found that the $SiO_2$ film formed by thermal oxidization to 1000 angstroms thickness was completely etched off in three minutes. It is to be noted that the etching time for an $SiO_2$ film formed by thermal oxidization can be shortened greatly, as compared to a natural evaporation type vapor phase dissolving unit.

The heating temperature of the heater 45 is not limited to 80° C., but any desired temperature may be set so long at it is the room temperature or higher, and the reagent boiling point temperature or lower. The sample droplets were quantitatively analyzed by polarization Zeeman spectroscopy with graphite reactor. It was found that Fe and Ni could be measured at a precision of 3 of $5*10^{-13}$ g/cm$^2$ and Cu and Cr could be measured at a precision of 2 to $10*10^{-14}$ g/cm$^2$. The background impurity concentration was suppressed to a very small level.

An $Si_3N_4$ film of 1000 angstroms thick formed on an Si wafer by an LPCVD method was used as the specimen 53 by using the same apparatus and conditions. The $Si_3N_4$ film was completely dissolved in ten minutes.

After the extraction experiment, the two-way valves V48 and V58 were opened to drain exhaust liquids on the bottoms of the container 41 and housing 51 via the drains 48 and 58. Hydrofluoric acid and Si fluoride in the exhaust gas processing unit 60 were neutralized by caustic soda so that the carrier gas at the gas outlet 65 was unharmful.

Another embodiment will be described in which the types and concentrations of fine particles floating in a clean room are detected by using the above-described ultra high purity trace substance extracting apparatus.

An Si wafer with a cleaned mirror surface was placed in the clean room. A natural oxide film of 50 to 100 angstroms was formed on the Si wafer surface. After the lapse of a sufficient time, the specimen 53 was placed on the cooling vessel 52 and held in position by the pusher 54, with the particle attached surface being turned up.

In extracting trace substance from the specimen surface, $HNO_3$ solution of 61 weight % was used as the reagent 43.

Similar to the above embodiment, the nitrogen gas substitution for the purified gas generator 40, vapor phase dissolving unit 50, and gas pipe 70, the cooling of the cooling vessel by cooled water, and the heating of the gas pipe 70 and vapor phase dissolving unit 50, were preformed. Thereafter, nitric acid aqueous solution as the reagent 43 was heated.

Until the nitric acid aqueous solution had been heated, similar to the above-described embodiment, generated reagent vapors and nitrogen carrier gas were introduced via the exhaust gas outlet 49b and gas pipe 71 to the exhaust gas processing unit 60 by operating the three-way valve V49.

After the temperature of the reagent 43 became stable, the three-way valve V49 was operated to introduce the nitric acid aqueous solution and nitrogen carrier gas to the vapor phase dissolving unit 50 via the gas outlet 49c and gas pipe 70.

After the lapse of five minutes, the three-way valve V49 was again operated to switch the gas passage from the exhaust gas outlet 49b to the exhaust gas processing unit At the same time, the two-way valve V55 was closed and the two-way valve V56 was opened to purge the residual gas in the housing 51 of the vapor phase dissolving unit 50 by the nitrogen gas.

Thereafter, the vapor phase dissolving unit 50 was opened to pick up droplets of nitric acid aqueous solution formed on the surface of the Si wafer by a micro pipet. $SiO_2$ is stable with respect to the nitric acid solution. Therefore, the Si wafer did not dissolved and only the particles on the wafer were dissolved in the form of droplets.

The sample droplets were quantitatively analyzed by polarization Zeeman spectroscopy with graphite reactor. It was found that Na and K in the particles could be measured at a precision of 2 to $5*10^{-13}$ $g/cm^2$.

As described above, in the trace substance extracting apparatus, the functions of the purified gas generator and the vapor phase dissolving unit are provided separately. In the purified gas generator, high purity reagent vapors are generated by heating the reagent and filtered by the hydrophobic porous film to make them of a ultra high purity.

In the vapor phase dissolving unit, a specimen is cooled by the cooling vessel to liquidize the heated reagent gas on the surface of the specimen, thereby dissolving the extracted trace substance into ultra high purity droplets. Since the surface of the specimen is cooled, the reaction of the reagent gas is lowered to prevent excessive etching. Since the functions are separately provided, the gas substitution can be performed easily, and the repeatability of experiments can be improved.

It is possible to extract impurities on a surface layer at a ultra high sensitivity and in a very short time. The precision of extraction can be improved to 3 to $6*10^{-13}$ $g/cm^2$ for Fe and Ni, 2 to $10*10^{-14}$ $g/cm^2$ for Cu and Cr, and 2 to $5*10^{-13}$ $g/cm^2$ for Na and K.

Use of gas substitution and the exhaust gas processing unit provides the safety of experiments. This apparatus is particularly useful for extracting a very small amount of impurities on a semiconductor wafer surface.

The extraction of such trace substance may be applied to other devices such as floppy disks and laser disks.

Figure 8:
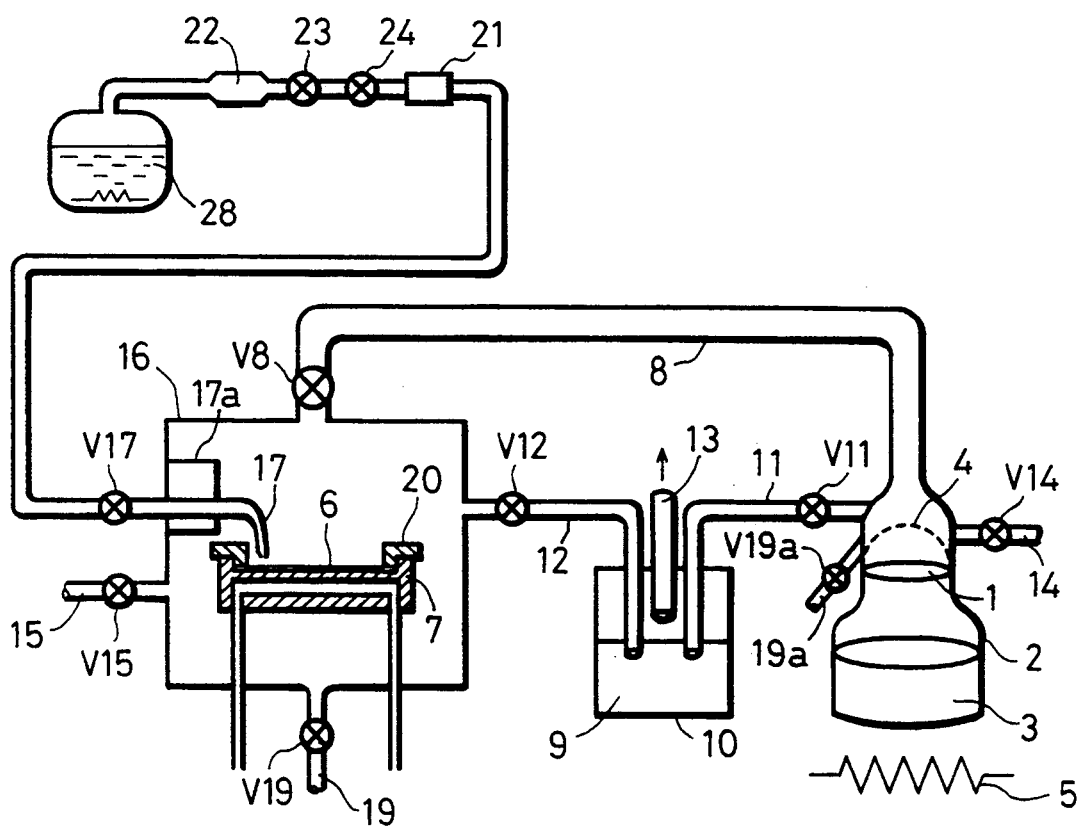
FIG. 8 is a schematic diagram showing the fundamental structure of the trace substance extracting apparatus according to a second embodiment of the present invention.

FIG. 8 shows the fundamental structure of a trace substance extracting apparatus according to the second embodiment of the present invention. Similar to the first embodiment, the apparatus has as its main units, a ultra high purity gas generator, and a reaction unit for reacting a specimen 6 with the purified gas and for extracting trace substance contained in the specimen.

The purified gas generator shown on the right side of FIG. 8 is the same as that of the first embodiment shown in FIG. 1.

In the reaction unit shown on the left side of FIG. 8, the specimen 6 is placed on a cooling vessel 7. A nozzle 17 is disposed near the surface of the specimen 6 to blow a high purity inert gas. The nozzle 17 can be moved along the surface of the specimen by a nozzle drive mechanism 17a having a motor, moving mechanism, and the like. The nozzle drive mechanism 17a can drive the nozzle 17 at least in one-dimension, and more preferably in two- or three-dimension.

The specimen placed on the cooling vessel 7 is fixed by a specimen pusher 20 and only a predetermined area of the surface of the specimen 6 is exposed. The specimen 7, cooling vessel 7, and nozzle 17 are accommodated in the reaction unit 16 connected to a gas supply system 8. The inner space of the unit 16 is made air tight.

Reagent vapors from the gas supply system 8 are supplied to the surface of the specimen 6 and react with the specimen to form by-products. Since the specimen 6 is cooled by the cooling vessel 7, the reagent vapors are liquidized on the surface of the specimen to form droplets.

Cooled water is flown in the cooling vessel 7 to cool it down to a predetermined temperature and maintain it at this temperature. Cooling media other than cooled water may also be used.

The reaction unit 16 has a gas exhausting system including a valve V12 and a gas pipe 12. Reagent vapors and the like after reacting with the specimen 6 are transported via the gas pipe into exhaust gas processing liquid 9 in an exhaust gas processing vessel 10 like the first embodiment shown in FIG. 1, and bubbled in the liquid 9.

In addition to the gas pipe 12, the reaction unit 16 has another gas pipe 15 with a valve V15. The gas pipe 15 is used for introducing inert gas or the like to the reaction unit 16 to purge the inner space of the unit 16.

The apparatus for sampling droplets formed on the specimen 6 will be described. Referring to FIG. 8, nitrogen gas vaporized from liquid nitrogen 28 passes through a nitrogen gas purifier 22, a pressure reducing valve 23, a flow valve 24, and a nitrogen gas filter 21. The nitrogen gas is thereby purified and the pressure of the nitrogen gas is controlled. Such purified and pressure-controlled nitrogen gas is supplied via the valve V17 to the nozzle 17.

The nozzle 17 has a tip opening of about 200 $\mu m$ diameter. The purified nitrogen gas has a dew point temperature of, for example, $-103°$ C. and has as high purity as the particles of 0.1 $\mu m$ diameter or larger cannot be detected.

Figure 9A:
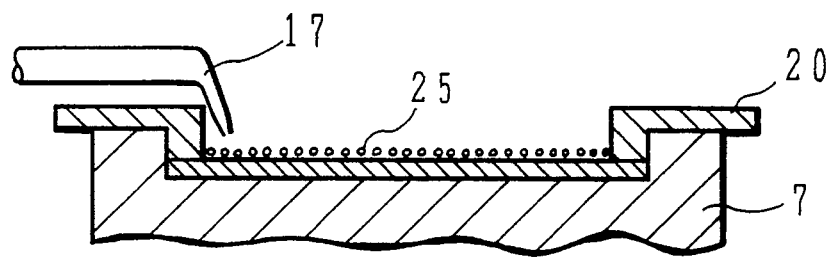
FIG. 9A is a cross sectional view showing the cooling vessel and a specimen to the surface of which fine droplets are attached, according to the second embodiment.

FIG. 9A illustrates the surface of a specimen after a dielectric film on the surface has been dissolved. A number of fine droplets 25 attach to the specimen surface.

Figure 9B:
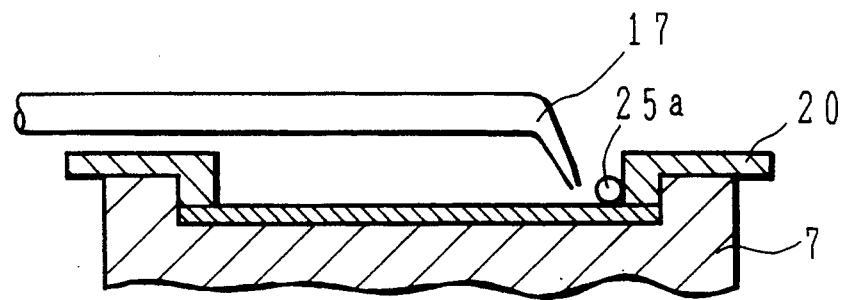
FIG. 9B is a cross sectional view showing the cooling vessel and a specimen in which droplets shown in FIG. 9A are collected to form a single large droplet, according to the second embodiment.

Nitrogen gas is blown from the nozzle 17 to the specimen surface. Droplets are rolled while swinging the nozzle 17 to the right and left sides starting from one end of the specimen pusher 20, and collected at the other end as shown in FIG. 9B. The droplet 25a with a large diameter can be picked up easily by a micro piper or the like.

The following description is directed to dissolving a thermal oxide film formed on an Si wafer by using the trace substance extracting apparatus shown in FIG. 8. Used as the specimen 6 was an Si wafer of 6 inches diameter having a thermal oxide film of 1000 angstroms thick. Hydrofluoric acid aqueous solution of 50 weight % was used as the reagent 3.

The Si wafer 6 was placed on the cooling vessel 7 and fixed by the pusher 20 to expose a desired area of the Si wafer surface. Water cooled to 7° C. was flown in the cooling vessel 7 to cool the Si wafer 6. The temperature of water is not limited to 7° C., but any other temperature may be set which is 0° C. or higher and the dew point temperature of the reaction unit 16 or lower.

The reaction unit 16 was pre-heated to 50° C. The valve V15 was opened to introduce the nitrogen gas into the reaction unit 16, and the valve V12 was opened to exhaust the nitrogen gas. In this way, the inner space of the reaction unit 16 was made a nitrogen gas atmosphere.

At the same time, the container 2 was heated to raise the temperature of the hydrofluoric acid aqueous solution 3 to 80° C. Hydrofluoric acid vapors (hydrofluoric acid gas and water vapors) were purified by the hydrophobic porous film 4 and supplied to the gas supply system 8. In this case, the valves V11 and V14 were opened and the valve V8 was closed.

A predetermined amount of dried nitrogen gas was introduced from a gas introducing means 14, mixed with the hydrofluoric acid vapors, and exhausted via the pipe 11. During a predetermined time period, this process was continued to make the mixed gas (etching gas) of the hydrofluoric acid and nitrogen gas have a steady state with a constant temperature and a constant flow rate.

After the steady state was realized, the valves V11 and V15 were closed and the valve V8 was opened to supply the etching gas to the reaction unit 16. The $SiO_2$ film on the surface of the Si wafer 6 was dissolved by the hydrofluoric acid vapors, and fine droplets of several tens fm to several hundreds fm were formed on the Si wafer surface 6. After supplying the hydrofluoric acid vapors for two hours, the valve V8 was closed and the valve V15 was opened to exhaust the hydrofluoric acid vapors in the reaction unit 16. At the same time the valve V1 was opened to exhaust the hydrofluoric acid vapors in the container 2 via the gas pipe 11.

Next, purified nitrogen gas was blown from the nozzle 17 to droplets on the Si wafer surface. Droplets were rolled while swinging the nozzle to the right and lest sides, and collected as a single large droplet. The capacity of this droplet was about 0.8 to 1 ml.

Figure 10:
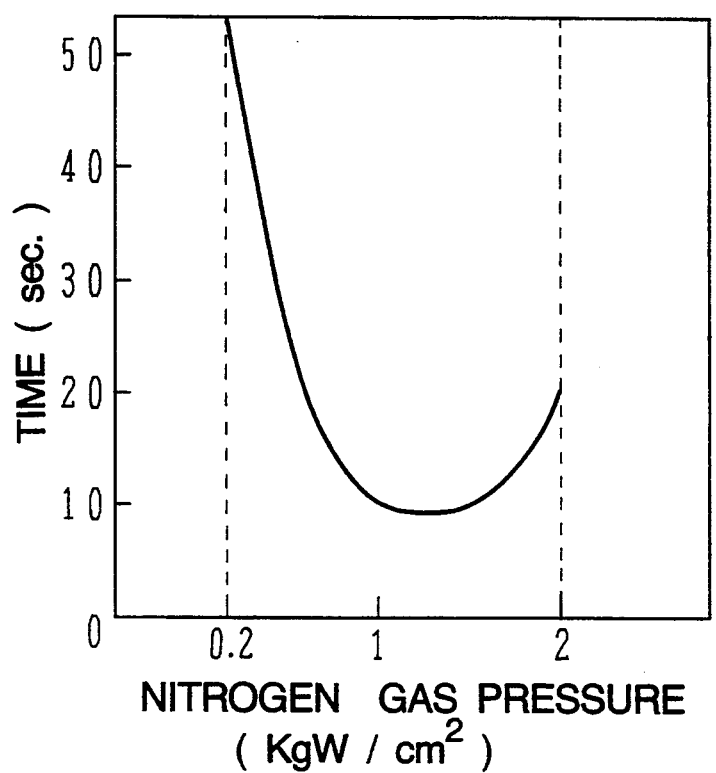
FIG. 10 is a graph showing the time required for collecting droplets relative to the nitrogen gas pressure, according to the second embodiment.

FIG. 10 is a graph showing the relationship between the nitrogen gas pressure and the time required for collecting droplets as a single large droplet. Droplets could not roll at the nitrogen gas pressure of 0.2 kg-weight/$cm^2$. Droplets were blown out at the nitrogen gas pressure of 2 kg-weight/$cm^2$ and could not be collected. Droplets could be collected in about 10 seconds at the nitrogen pressure of about 1 kg-weight/$cm^2$. In order not to contaminate the environments, it is preferable to collect droplets in as short a time as possible.

Another embodiment will be described in which the types and concentrations of fine particles floating in a clean room are detected by using the above-described ultra high purity trace substance extracting apparatus.

The sample liquid was quantitatively analyzed by polarization Zeeman spectroscopy with graphite reactor. It was found that the lower measurement limits of surface impurity concentrations of Fe, Al, Cu, and Ni were $10^9$ to $10^{10}$ $cm^{-2}$.

As described above, by blowing an inert gas to a number of droplets, they can be collected and picked up easily. Contamination can be suppressed by recovering droplets in a short time.

In the second embodiment, the specimen 6 has been placed horizontally on the cooling vessel 7. The specimen 6 may be disposed upright or obliquely.

FIGS. 11A and 11B show a specimen disposed upright. FIG. 11A is a front view and FIG. 11B is a side view in section. A cooling vessel 7a has a surface for disposing the specimen upright. The specimen 6 is fixed to the cooling vessel 7a by a specimen pusher 20a.

A liquid reservoir 26 for collecting droplets is provided under the specimen 6. A nozzle 17a for blowing an inert gas to the surface of the specimen 6 is disposed above the specimen 6. The tip of the nozzle 17a may be divided into a plurality of tips for blowing an inert gas over the whole surface of the specimen at the same time.

Figure 12:
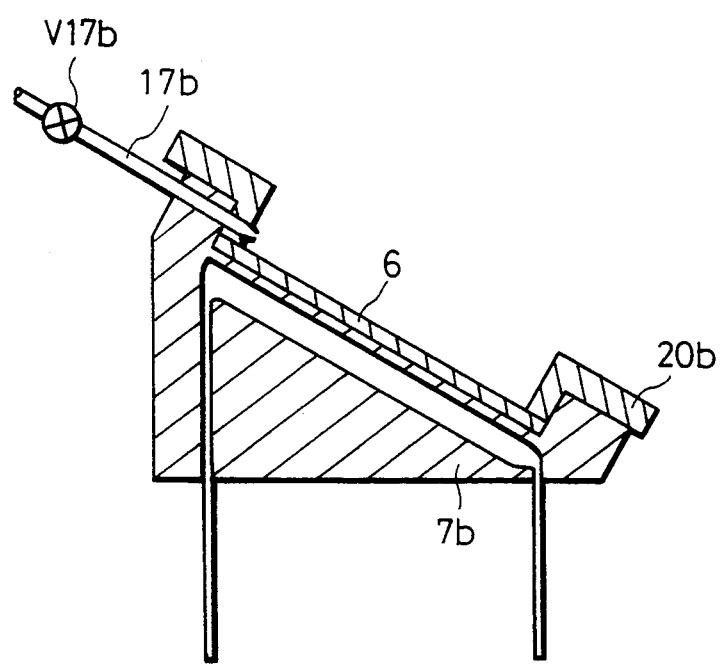
FIG. 12 is a cross sectional view showing the cooling vessel, specimen, and nozzle in which the specimen is placed obliquely, according to another modification of the second embodiment.

FIG. 12 shows the specimen 6 disposed obliquely. A cooling vessel 7b has a surface for disposing the specimen 6 obliquely. The specimen 6 is placed on this surface and fixed by a specimen pusher 20b. A nozzle 17b is disposed above the oblique surface supporting the specimen 6. The nozzle 17b can blow an inert gas downward from the higher position in parallel to the specimen surface. Like the nozzle 17b shown on the left side of FIG. 11, the tip of the nozzle 17b may be divided into a plurality of tips. A nozzle drive mechanism may also be provided.

Droplets can be more easily collected by disposing the specimen upright or obliquely than disposing it horizontally.

Figure 13:
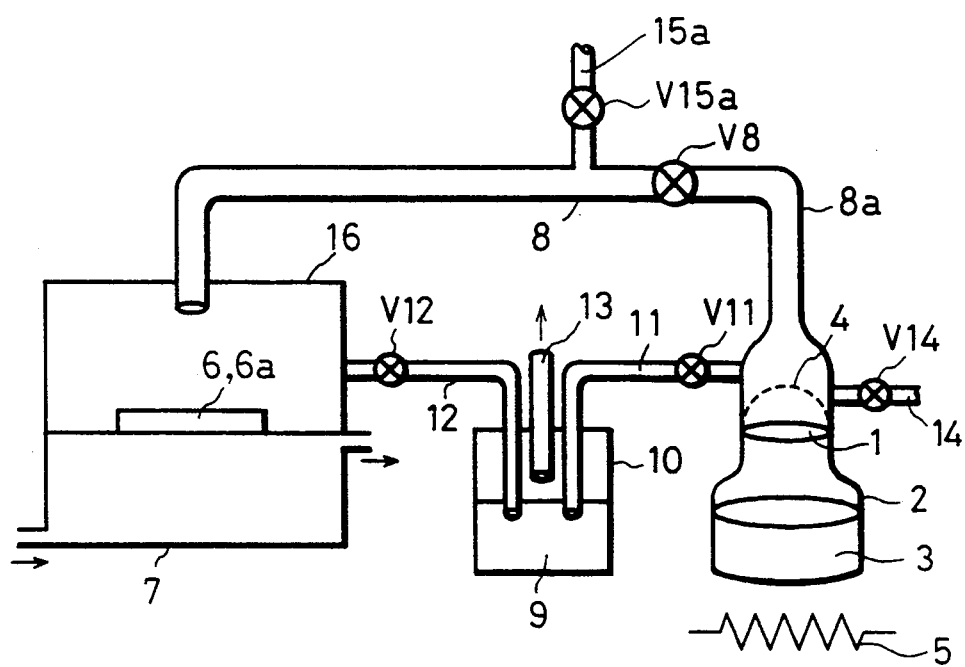
FIG. 13 is a schematic diagram showing the fundamental structure of the vapor phase dissolving apparatus according to a third embodiment of the present invention.

FIG. 13 shows the fundamental structure of the vapor phase dissolving apparatus according to the third embodiment of the present invention. The apparatus has basically the same structure as that of the first embodiment shown in FIG. 1.

A heating means 5 is disposed near a container 2 of the purified gas generator to uniformly heat the inside of the container and maintain it at a predetermined temperature. Hydrofluoric acid aqueous solution 3 in the container 2 is heated to a predetermined temperature and vaporized at a constant speed. In this embodiment, it is important to vaporize the hydrofluoric acid aqueous solution at a constant speed. The heating means 5 is preferably constructed of a ribbon heater, a rubber heater, or the like which can uniformly heat the main surface of the container 2.

The generated hydrofluoric acid vapors are supplied via a hydrophobic porous film 4 to a gas supply system 8a.

In the reaction unit 16 shown on the left side of FIG. 13, an object 6 is placed on a cooling vessel 7. The space enclosing the object 6 is communicating with the gas supply system 8, and is made air tight. The gas supply system 8 is connected to a gas supply system 8a via a valve V8. A gas pipe connected to the gas supply system 8a is used for introducing a carrier gas such as $N_2$ gas. By vaporizing the hydrofluoric acid aqueous solution 3 in the container 2 and introducing the carrier gas from the gas pipe 14, it is possible to obtain a desired flow ratio of the hydrofluoric acid vapors to the carrier gas. The etching gas having the desired flow ratio is supplied to the reaction unit 16.

It is preferable to heat the gas supply systems 8 and 8a and the bottom of the reaction unit 16 by ribbon heaters or the like to maintain the container 2 and peripheral units at a desired temperature. In this way, the hydrofluoric acid vapors generated by heating with the heating means 5 can be supplied to the reaction unit 16 via the gas supply systems 8a and 8 without liquidizing them.

A gas pipe 15a with a valve V15a is connected to the reaction unit 16 via the gas supply system 8. The gas pipe 15a is used for introducing a gas such as an inert gas to the reaction unit 16 to purge the inner space of the reaction unit 16.

The following description is directed to etching an $SiO_2$ film of 1000 angstroms thick formed on an Si wafer by thermal oxidization by using the vapor phase dissolving unit shown in FIG. 13.

An Si wafer 6a was placed on the cooling vessel 7. Cooled water was flown in the cooling vessel 7 to cool the Si wafer 6a. The temperature of the cooled water is not limited to 7° C., but any other temperature may be set if it is 0° C. or higher or the dew point temperature in the reaction unit 16 or lower.

The reaction unit 16 was pre-heated to 80° C. The valve V15a was opened to introduce the dried nitrogen gas into the reaction unit 16, and the valve V12 was opened to exhaust the nitrogen gas. In this way, the inner space of the reaction unit 16 was made a nitrogen gas atmosphere.

At the same time, the container 2 was heated to maintain the hydrofluoric acid aqueous solution 3 at a predetermined temperature. Hydrofluoric acid vapors (hydrofluoric acid gas and water vapors) were purified by the hydrophobic porous film 4 and supplied to the gas supply system 8. In this case, the valves V11 and V14 were opened and the valve V8 was closed.

A predetermined amount of dried nitrogen gas was introduced from a gas pipe 14, mixed with the hydrofluoric acid vapors in the gas supply system 8a, and exhausted via the pipe 11 by bubbling the hydrofluoric acid vapors and nitrogen gas in the exhaust gas processing liquid 9. During a predetermined time period, this process was continued to make the mixed gas (etching gas) of the hydrofluoric acid and nitrogen gas have a steady state with a constant temperature and a constant flow rate.

After the steady state was realized, the valves V11 and V15a were closed and the valve V8 was opened to supply the etching gas to the reaction unit 16. The $SiO_2$ film on the surface of the Si wafer 6a was etched by the etching gas supplied via the gas supply system 8.

Since the surface of the Si wafer 6a was maintained at the dew point temperature or lower, smoggy droplets attached to the surface of the $SiO_2$ film. Namely, there was always water on the surface where the dissolution reaction of $SiO_2$ occurred, the water functioning as a catalysis. Therefore, the $SiO_2$ dissolution reaction was promoted increasing the etching speed.

After the etching was performed for a predetermined time, the valve V8 was closed and the valve V15a was opened to exhaust the hydrofluoric acid vapors in the reaction unit 16. At the same time, the valve V11 was opened to exhaust the hydrofluoric acid vapors in the container 2 via the gas pipe 11.

Figure 14:
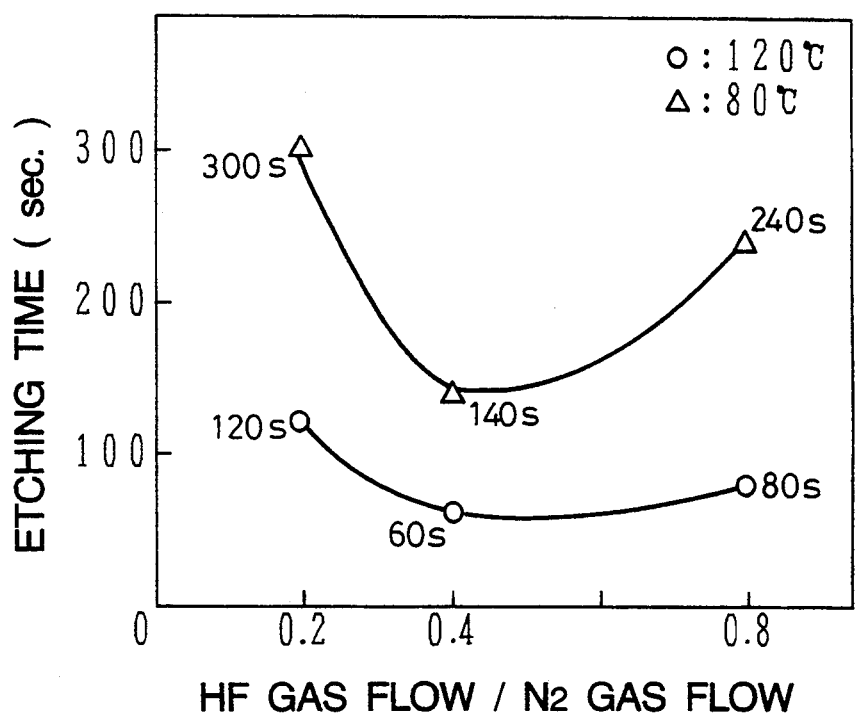
FIG. 14 is a graph showing the etching time for an $SiO_2$ film, according to the third embodiment.

FIG. 14 is a graph showing the time require for etching the $SiO_2$ film of 1000 angstroms. The abscissa represents the flow ratio of the hydrofluoric acid gas (not hydrofluoric vapors) to $N_2$ gas, and the ordinate represents the time required for etching the $SiO_2$ film of 1000 angstroms. Circle marks are for the case the hydrofluoric acid aqueous solution 3 was heated to 120° C., and triangle marks are for the case the hydrofluoric acid aqueous solution 3 was heated to 80° C. The measurements were conducted at three points at which the flow ratios of hydrofluoric acid gas to the $N_2$ gas were 0.2, 0.4, and 0.8.

The $N_2$ gas flow rates were 1.6 l/min, 0.8 l/min, and 0.41 l/min, respectively for the temperature 120° C. of the hydrofluoric acid aqueous solution, and 1.31 l/min, 0.65 l/min, and 0.33 l/min, respectively for the temperature 80° C. of the hydrofluoric acid aqueous solution.

It can be known from FIG. 14 that as the temperature of the hydrofluoric acid aqueous solution is raised, the etching speed for the $SiO_2$ film can be increased. The etching speed takes a maximum value when the flow ratio of the hydrofluoric acid gas to the $N_2$ gas is about 0.4. The flow rate of the hydrofluoric acid gas is determined mainly by the temperature of the hydrofluoric acid solution so that changing the flow rate is equivalent to changing the flow rate of the $N_2$ gas.

Therefore, by setting the flow ratio of the hydrofluoric acid gas to the $N_2$ gas to the value near to the maximum etching speed, it is possible to reduce the dependency of the etching speed on the flow rate of the $N_2$ gas.

Namely, the etching condition can be selected so that the etching speed scarcely depends on the flow rate of the $N_2$ gas and depends generally only on the temperature of the hydrofluoric acid aqueous solution. Accordingly, the etching speed easy to be controlled and stable can be obtained.

In a conventional vapor phase dissolution method for etching an $SiO_2$ film, the etching speed becomes slow if the temperature of the hydrofluoric acid aqueous solution is raised. This is conceivable from that water functioning as a catalysis is vaporized and not supplied to the $SiO_2$ surface because the object temperature is higher than the room temperature.

In this embodiment, the object is being cooled so that droplets always attach to the surface of the $SiO_2$ film. The increased etching speed is conceivable from the raised temperature of the hydrofluoric acid aqueous solution and the presence of water as a catalysis always on the surface of the $SiO_2$ film.

It can be easily anticipated that as the temperature of the object is lowered, droplets on the $SiO_2$ film surface become icy and the function of water catalysis cannot be expected. It is therefore conceivable that the etching speed will become slow as the temperature of the object lowers.

Therefore, the etching speed takes a maximum value at a certain temperature of the object. It is possible to stabilize the etching speed relative to a change in the object temperature by setting the object temperature near to the value where the etching speed takes the maximum value. Under this condition, the etching speed is controlled substantially only by the temperature of the hydrofluoric acid aqueous solution.

In this embodiment, an Si wafer is used as the object and the surface oxide film is etched. The object is not limited only to an Si wafer. It is obvious for those skilled in the art to use other objects such as a natural oxide film, a PSG film and BPSG Film by a CVD method, an oxide film by a TEOS method, and a spin-on-glass film.

In this embodiment, an $N_2$ gas is used as the carrier gas. Other inert gas such as argon gas may also be used.

Figure 15:
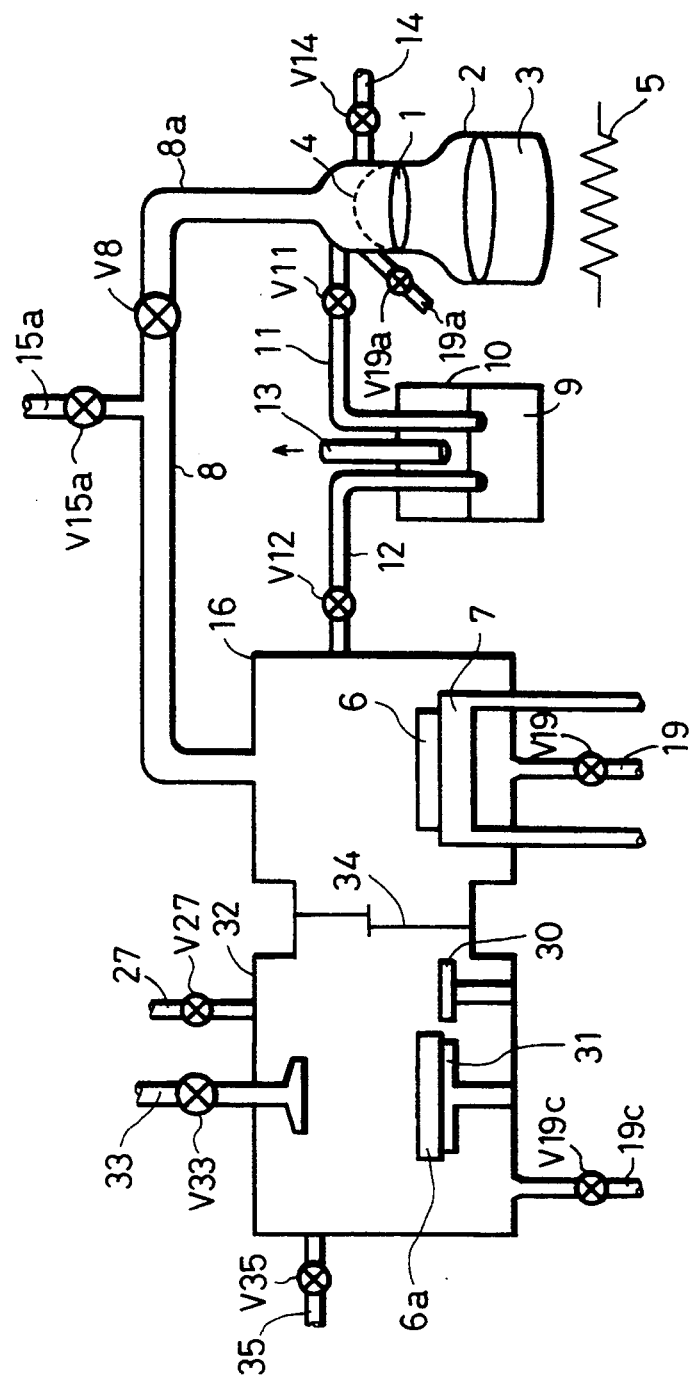
FIG. 15 is a schematic diagram showing the fundamental structure of the cleaning apparatus according to a fourth embodiment of the present invention.

FIG. 15 shows the fundamental structure of a cleaning apparatus according to the fourth embodiment of the present invention. This apparatus has as its main unit a generator for generating ultra high purity hydrofluoric acid gas, a reaction unit 16 for accommodating an object 6 and reacting hydrofluoric acid vapors with $SiO_2$ to etch an $SiO_2$ film formed on the surface of the object 6, and a rinsing/drying chamber 32 for rinsing and drying an object 6a.

The purified gas generator of this embodiment has the structure same as that of the third embodiment shown in FIG. 13.

In the reaction unit 16 shown at the central area of FIG. 15, the object 6 is placed directly on a cooling vessel 7. The space encircling the object is communicating with a gas supply system 8, and is made generally air tight.

Cooled water is flown in the cooling vessel to maintain a temperature equal to or lower than the dew point temperature of the reaction unit 16. Cooling media other than cooled water may also be used.

The reaction unit 16 is provided with an exhaust system having a valve V12 and a gas pipe 12. Hydrofluoric acid vapors and the like after the reaction with $SiO_2$ on the surface of the object 6 are guided via the gas pipe 12 to an exhaust gas processing vessel 10 like the first embodiment shown in FIG. 12, and bubbled in exhaust gas processing liquid 9.

It is preferable to heat gas supply systems 8 and 8a and the bottom of the reaction unit 16 by ribbon heaters or the like to maintain a container 2 and peripheral units at a desired temperature. In this way, the hydrofluoric acid vapors generated by heating with a heating means 5 can be supplied to the reaction unit 16 via the gas supply systems 8a and 8 without liquidizing them.

A gas pipe 15a with a valve V15a is connected to the reaction unit 16 via the gas supply system 8. The gas pipe 15a is used for introducing a gas such as an inert gas to the reaction unit 16 to purge the inner space of the reaction unit 16.

It is preferable to provide liquid drains 19a and 19 communicating with the container 2 above the surface of a hydrophobic porous film 4 and with the reaction unit 16 and to drain liquids.

The rinsing/drying chamber 32 and reaction unit 16 shown on the left side of FIG. 15 are partitioned by a shutter 34 to maintain an air tight state of each space. The object 6 on the cooling vessel 7 can be moved and placed on a spinner 31 in the rinsing/drying chamber 32 by opening the shutter 34 and using an object transporter 30.

A pure water introducing means 33 is connected via a valve V33 to the inside of the rinsing/drying chamber 32 above the spinner 31.

A drain 19c having a valve V19c is connected to the bottom of the rinsing/drying chamber 82. Exhaust liquid after rinsing the object 6a is drained from the drain 19c.

A gas introducing means 27 and a gas exhaust means 85 are connected to the rinsing/drying chamber 32 via respective valves V27 and V35. The gas introducing means 27 and gas exhaust means 35 are used for introducing a gas such as a dried inert gas into the rinsing/drying chamber 32 for purging the inner space of the rinsing/drying chamber 32 and drying the object 6a.

The following description is directed to cleaning an Si wafer surface formed with an $SiO_2$ film of 1000 angstroms thick by thermal oxidization by using the cleaning apparatus shown in FIG. 15.

An Si wafer 6 was placed on the cooling vessel 7. Water cooled to 7° C. was flown in the cooling vessel 7 to cool the Si wafer 6. The temperature of the cooled water is not limited to 7° C., but any other temperature may be set if it is 0° C. or higher or the dew point temperature in the reaction unit 16 or lower.

The reaction unit 16 was pre-heated to 80° C. The valve V15a was opened to introduce dried nitrogen gas into the reaction unit 16, and the valve V12 was opened to exhaust the nitrogen gas. In this case, the shutter 34 was closed to maintain the reaction unit 16 generally air tight. In this way, the inner space of the reaction unit 16 was made a nitrogen gas atmosphere.

At the same time, the container 2 was heated to maintain the hydrofluoric acid aqueous solution 3 at 120° C. Hydrofluoric acid vapors were purified by the hydrophobic porous film 4 and supplied to the gas supply system 8. In this case, the valves V11 and V14 were opened and the valve V8 was closed.

Dried nitrogen gas was introduced at the flow rate of 0.8 l/min from a gas pipe 14, mixed with the hydrofluoric acid vapors in the gas supply system 8, and exhausted via the pipe 11 by bubbling the hydrofluoric acid vapors and nitrogen gas in the exhaust gas processing liquid 9. During a predetermined time period, this process was continued to make the mixed gas (etching gas) of the hydrofluoric acid and nitrogen gas have a steady state at a temperature of 120° C. The flow ratio of the hydrofluoric acid vapors to the nitrogen gas was 0.4.

In this embodiment, the temperature of the hydrofluoric acid aqueous solution is set to 120° C. and the nitrogen gas flow rate is set to 0.8 l/min. The other conditions may also be used to clean the surface of an object. The etching speed for an $SiO_2$ film changes with the temperature of the hydrofluoric acid aqueous solution. It is therefore preferable to properly set the temperature of the hydrofluoric acid aqueous solution and obtain a desired etching speed.

After the steady state was realized, the valves V11 and V15a were closed and the valve V8 was opened to supply the etching gas to the reaction unit 16 via the gas supply system 8. The $SiO_2$ film on the surface of the Si wafer 6 in the reaction unit 16 was etched by the etching gas supplied via the gas supply system 8.

After part or all of the $SiO_2$ film was removed, the surface of the Si wafer 6 was being maintained at the dew point temperature or lower. Therefore, smoggy droplets attached to the surface of the $SiO_2$ film. Impurity elements such as metal were dissolved in these smoggy droplets, preventing the re-attachment of impurity elements to the active Si wafer surface with the $SiO_2$ film being removed.

After the etching was performed for a predetermined time, the valve V8 was closed and the valve V15a was opened to exhaust the hydrofluoric acid vapors in the reaction unit 16. At the same time, the valve V11 was opened to exhaust the hydrofluoric acid vapors in the container 2 via the gas pipe 11. At the same time, the valves V35 and V27 were opened to introduce the nitrogen gas into the rinsing/drying chamber 32 to provide a nitrogen gas atmosphere.

Next, the shutter 34 between the reaction unit 16 and rinsing/drying chamber 32 was opened, and the Si wafer was moved from the cooling vessel 7 to the spinner 31 by the object transporter 30.

The shutter 34 and valves V27 and V35 were closed and the valve V19c was opened. Thereafter, the Si wafer was rotated at 1000 rpm. At the same time, the valve V33 was opened to supply pure water to the surface of the Si wafer 6a to perform pure water rinsing for about one minute.

Next, the valves V33 and V19c were closed and the valves V27 and V35 were opened. While flowing dried nitrogen gas into the rinsing/drying chamber 32, the rotation speed of the Si wafer 6a was raised to 3000 rpm and the Si wafer 6a was dried.

FIGS. 16A and 16B are graphs showing the impurity concentrations on the surfaces of Si wafers cleaned by the embodiment apparatus. The concentrations of residual Fe and Cu on Si wafers were measured using total reflection fluorescent X-rays.

Shown in the graphs of FIGS. 16A and 16B are the measurement results of control wafers before cleaning, the measurement results of Si wafers without cooling, and the measurement results of Si wafers cleaned by the embodiment apparatus.

As shown in FIG. 16A, the concentrations of Fe on Si wafers without cooling and cleaned by the embodiment apparatus were smaller than the detection limit. As shown in FIG. 16B, the concentration of Cu on Si wafers without cooling was in the order of $10^{10}$ cm$^{-2}$. This may be reasoned from that Cu atoms strongly couple to the active Si wafer surface because Cu has a lower ionization tendency than Si.

The concentrations of Cu on Si wafers cleaned by the embodiment apparatus were also as low as the detection limit. This may be reasoned from that Cu atoms are dissolved in fine droplets attached to the Si wafer while etching the SiO$_2$ film and they are washed out before the re-attachment to the Si wafer surface.

In this embodiment, the pure water rinsing is performed immediately after etching the SiO$_2$ film by hydrofluoric acid vapors. A mixed gas of hydrochloric acid gas and nitrogen gas may be supplied to the Si wafer before the pure water rinsing.

The supply of hydrochloric acid gas generates fine hydrochloric acid droplets on the Si wafer surface, improving the removal operation of metal elements such as Cu and Ni. The supply of hydrochloric acid vapors may be performed at the time when hydrofluoric acid vapors are supplied.

Figure 17:
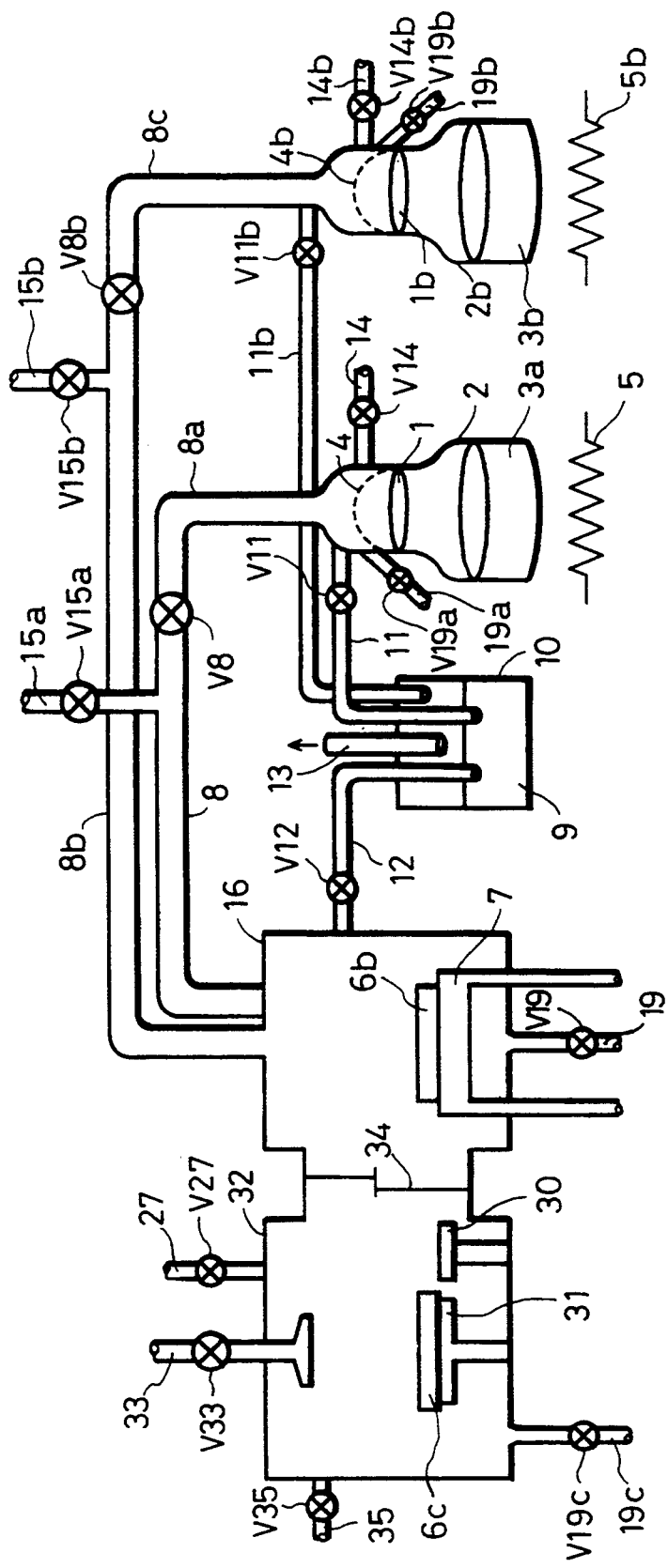
FIG. 17 is a schematic diagram showing the fundamental structure of the cleaning apparatus which is a modification of the fourth embodiment of the present invention.

FIG. 17 shows the fundamental structure of the cleaning apparatus capable of supplying hydrochloric acid vapors after supplying hydrofluoric acid vapors or at the same time. The cleaning apparatus shown in FIG. 17 has another container 2b like the container 2 shown in FIG. 15, another hydrophobic porous film 4b like the film 4 shown in FIG. 15, and another heating means 5b like the means 5 shown in FIG. 15. The containers 2 and 2b accommodate hydrofluoric acid aqueous solution 8a and hydrochloric acid aqueous solution 3b, respectively.

A gas supply system 8c covers the space above a hydrophobic porous film 4b and is connected to a gas supply system 8b via a valve V8b. The gas supply system 8b is connected to a reaction unit 16 and supplies hydrochloric acid vapors (hydrochloric acid gas and water vapors) from the container 2b' to the reaction unit 16.

A gas supply system 8c is connected to gas pipes 11b and 14b having valves V11b and V14b. The gas pipe 11b is dipped into exhaust gas processing liquid 9 in an exhaust gas processing vessel 10 to introduce hydrochloric acid vapors into the exhaust gas processing liquid 9.

The gas pipe 14b introduces a carrier gas such as a nitrogen gas. Hydrochloric acid vapors having a desired flow ratio relative to the carrier gas can be supplied to the reaction unit 16 by heating and vaporizing hydrochloric acid aqueous solution in the container 2b and introducing the carrier gas via the gas pipe 14b.

A gas pipe 15b with a valve V15b is connected to the gas supply system 8b. The gas pipe 15b is used for introducing a gas such as an inert gas into the gas supply system 8b and reaction unit 16 to purge the inner space of the system and unit.

It is preferable to provide liquid drains 19a and 19b communicating with the containers 2 and 2b above the surfaces of the hydrophobic porous film 4 and 4b to drain liquids.

With the cleaning apparatus of this embodiment, the dissolution of an SiO$_2$ film, the vaporization of, and washing by, hydrofluoric acid aqueous solution and hydrochloric acid aqueous solution, and the drying, can be performed substantially in a closed system separated from an environment, preventing the contamination by the environment.

In this embodiment, N$_2$ gas is used as the carrier gas and purge gas. Other inert gas may also be used.

In the above embodiment, the reaction unit and rinsing/drying chamber are separately provided. A rinsing/drying means may be mounted in the reaction unit. In this case, an object is not necessary to be transported when the pure water rinsing process is performed after the SiO$_2$ film etching process.

Figure 18:
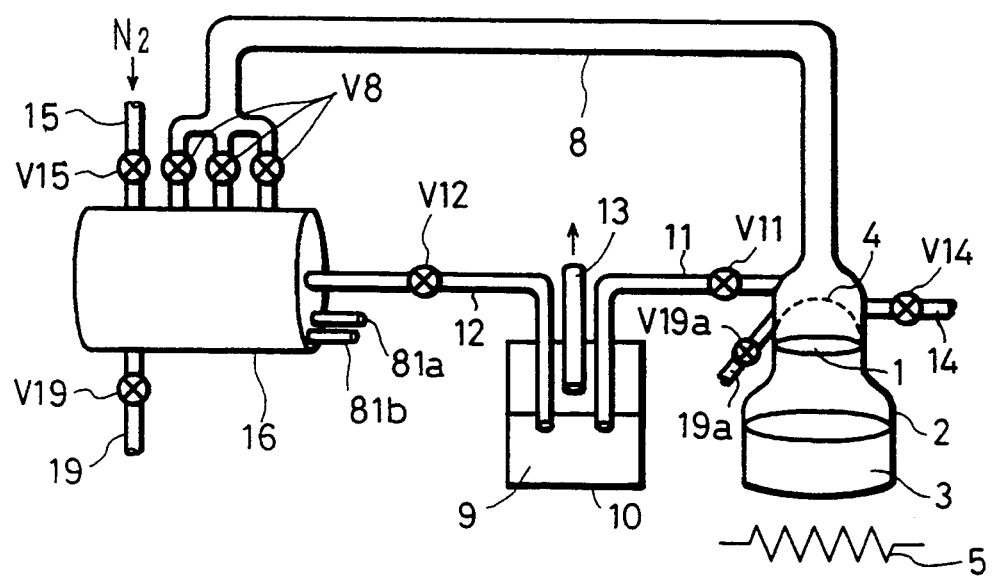
FIG. 18 is a schematic diagram showing the outline of the vapor phase treatment apparatus according to a fifth embodiment of the present invention.

FIG. 18 shows the fundamental structure of a vapor phase treatment apparatus according to the fifth embodiment of the invention. This apparatus has as its main units a generator for generating ultra high purity gas shown on the right side of FIG. 18, a reaction unit 16 for accommodating a specimen and reacting it with purified gas to dissolve a dielectric film on the specimen surface shown on the left side of FIG. 18, and an exhaust gas processing vessel shown at the middle of FIG. 18.

In this embodiment, a hydrophobic porous film 4 is made of a tetrafluoroethylene film having a number of small holes of 40 fm or smaller in diameter, and intercepts the passage of hydrophobic droplets of 40 Hm or larger in diameter.

A gas supply system 8 has three divided pipe openings on the side of the reaction unit 16, the pipes each having a valve V8 and being open to the reaction unit 16. Reagent vapors are introduced from the three openings into the reaction unit 16 so that the vapors are uniformly distributed over the surface of a specimen as will be detailed later.

A cooled water introducing means 81a and a cooled water draining means 81b are inserted into the wall of the reaction unit 16 and coupled to a specimen holder mounted in the reaction unit 16. Water for cooling a specimen is supplied from the cooled water introducing means 81a and drained from the cooled water draining means 81b.

The reaction unit 16 is provided with an exhaust gas system having a valve V12 and a gas pipe 12. Reagent vapors and the like after the reaction with the specimen are introduced via the gas pipe 12 to an exhaust gas processing vessel 10 like that of the first embodiment shown in FIG. 1, and bubbled in exhaust gas processing liquid 9.

It is preferable to maintain the gas supply system 8, container 2, and peripheral units at a desired temperature. In this way, reagent vapors generated by heating with a heating means 5 can be supplied to the reaction unit 16 via the gas supply system 8 without liquidizing them. The gas supply system 8 supplies reagent vapors to the reaction unit 16 from the three openings controlled by the valves V8.

In addition to the gas pipe 12, a gas introducing means 15 with a valve V15 is connected to the reaction unit 16. The gas introducing means 15 is used for introducing a gas such as an inert gas into the reaction unit 16 and purging the inner space of the reaction unit 16. A drain 19 with a valve V19 is connected to the bottom of the reaction unit 16.

Figure 19:
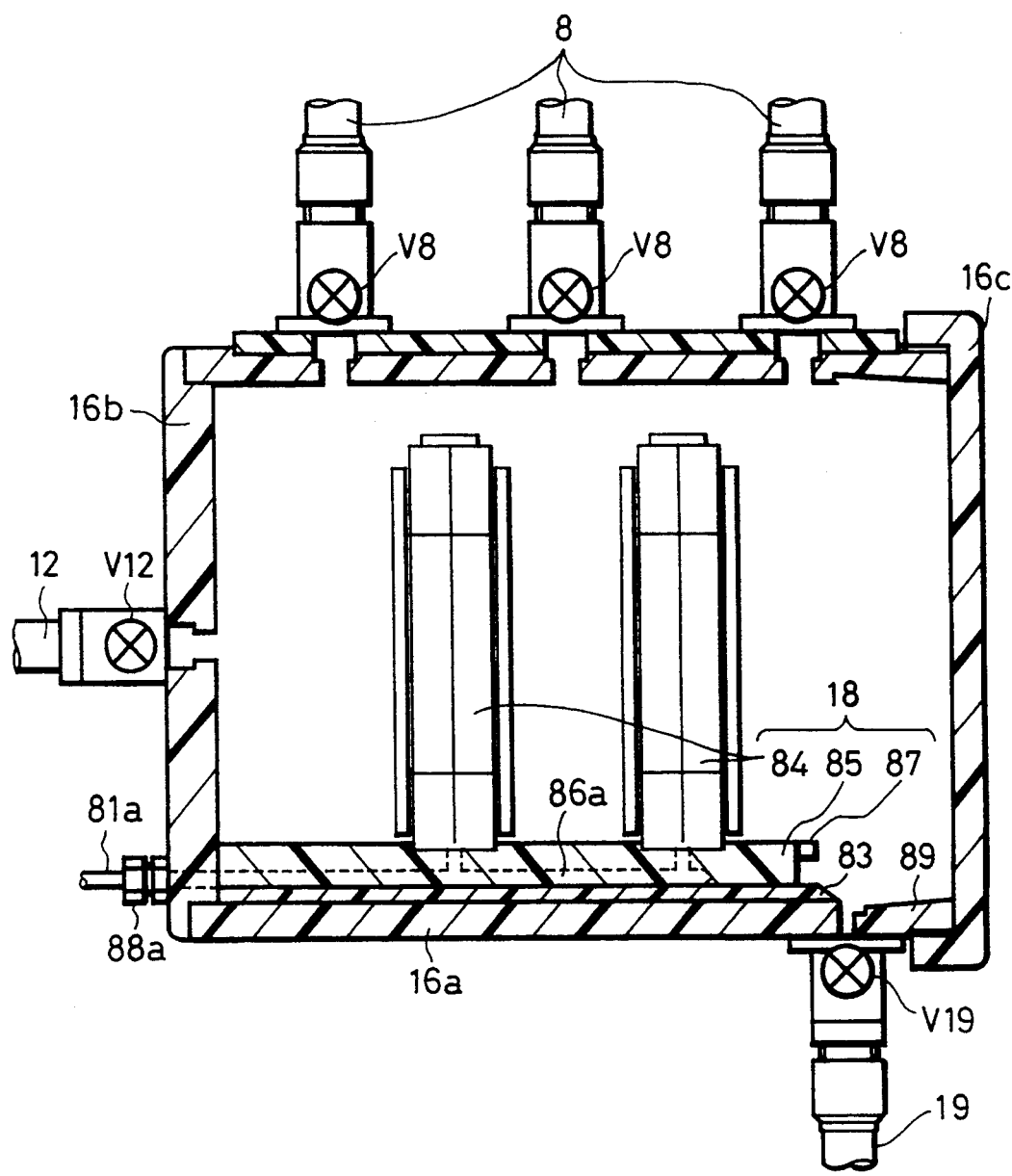
FIG. 19 is a cross sectional view showing the reaction unit according to the fifth embodiment.

FIG. 19 is a cross sectional view showing the cylindrical reaction unit 16 broken along the center axis of the unit 16. This reaction unit 16 has a cylindrical side wall 16a, a fixed lid 16b covering one opening of the cylindrical side wall 16a, and a removable lid 16c threaded on the other opening. When the lid 16c is covered, the reaction unit 16 is made air tight by a teflon packing provided at the coupling between the lid 16c and side wall 16a.

The three openings of the gas supply system 8 with the valves V8 are disposed on the upper side wall 16a to supply reagent vapors into the reaction unit 16. A drain 19 with a valve V19 is connected to the lower side wall 16a to drain exhaust liquids in the reaction unit 16.

In order for the exhaust liquids in the reaction unit 16 not to overflow to the outside when the lid 16c is removed, the inner surface of the side wall 16a on the lid 16c side is tapered so that the liquids flow into the drain 19.

A pipe 12 with a valve V12 is connected to the fixed lid 16b generally at the center thereof to take out reagent vapors after the reaction. Although not shown in FIG. 19, a gas introducing means 15 with a valve V15 is connected to the side wall 16a, as will be later described with reference to FIG. 20A, to introduce a nitrogen gas into the reaction unit 16.

A specimen holder 18 is mounted in the reaction unit 16, the specimen holder 18 having a cooling vessel support 85 and two cooling vessels 84. The bottom of the cooling support 85 is placed on the inner surface of the cylindrical side wall 16a of the reaction unit generally in tight contact with the inner surface. In order to stop the rotation of the cooling vessel support 85 about the cylindrical side wall 16a, a cooling vessel support fixing rail 83 formed on the side wall 16a in the axial direction is fitted in a groove formed in the bottom of the support 85 in the longitudinal direction.

The two cooling vessels 84 are fixedly mounted on the upper surface of the cooling vessel support 85 and spaced apart by a predetermined distance, the opposite side walls of each cooling vessel being perpendicular to the axis of the cylindrical reaction unit 16. Each cooling vessel 85 has an octagonal outer periphery, and can tightly hold two semiconductor wafers on its opposite side walls. It is preferable to mount the cooling vessels 84 on the support 85 such that each vessel is positioned between the openings of the gas supply system 8 to allow reagent vapors to be efficiently distributed to the semiconductor wafers.

A cooled water supply path 86a (not shown) and a cooled water drain path 86b (not shown) are formed in the cooling vessel support 85. The cooled water supply and drain paths 86a and 86b are open at one end surface of the support 85 and connected to the cooled water introducing means 81a and the cooled water draining means 81b (not shown in FIG. 19), respectively.

The cooled water introducing and draining means 81a and 81b are inserted into the fixed lid 16b and extended to the outside of the reaction unit 16. Fastening rings 88a and 88b squeeze the cooled water introducing and draining means 81a and 81b at the inserted positions on the fixed lid 16b to maintain an air tight state of the reaction unit 16. By loosening the fastening rings 88a and 88b, it is possible to move the cooled water introducing and draining means 81a and 81b in the right and left directions through the inserted positions.

The specimen holder 18 can be dismounted from the reaction unit 16 by removing the lid 16c and loosening the fastening rings 88a and 88b. A handle 87 is fixed to the other end surface of the cooling vessel support 85 to facilitate dismounting the specimen holder 18 from the reaction unit 16.

The cooled water supply and drain paths 86a and 86b are open to the inner spaces of the cooling vessels 84. Cooled water supplied from the cooled water introducing means 81a is flown via the cooled water supply path 86a into the inner spaces of the cooling vessels 84. The cooled water in the inner spaces of the cooling vessels 84 is flown via the cooled water drain path 86b to the cooled water draining means 81b and drained out of the reaction unit 16.

FIG. 20A is a cross sectional view of the reaction unit 16 broken at the plane perpendicular to the axis of the cylindrical reaction unit 16, and FIG. 20B is a cross sectional view of the cooling vessel 84 mounted in the reaction unit 16 broken at the center thereof.

The reaction unit 16 is supported on a platform 95. The gas introducing means 15 with the valve V15 is open in the side wall 16a at the position slightly lower than the apex of the wall 16a, and introduces nitrogen gas into the reaction unit 16. The cooling vessel support 85 is placed on the inner surface of the side wall 16a engaging with the cooling vessel support fixing rail 83, as described previously.

The cooled water supply path 86a is open under the circular inner space of tile cooling vessel 84 to supply cooled water from the lower side of the inner space. A cooled water path 86c is open above the circular inner space 91 at its one end, and is communicating via the inner space 91 with the cooled water drain path 86b. Cooled water supplied to the inner space 91 is drained, when it fills the inner space, via the cooled water path 86c and cooled water drain path 86b.

Wafer receiving plates 96 are provided on the opposite sides of the cooling vessel 84. A gap is formed between the wafer receiving plate and each side wall of the cooling vessel so that a semiconductor wafer 93 can be inserted down into this gap and held at the position concentric with the circular inner space 91. A circular hole 92 smaller in diameter than the semiconductor wafer 93 is formed in the wafer receiving plate 96 at the position concentric with the semiconductor wafer 93 held at the predetermined position.

Threads are formed on the wall of the circular hole 92 so that a ring wafer pusher 90 can be threaded into the hole. The wafer pusher 90 has a ring portion and a flange portion integrally formed on the ring portion. Threads are formed on the outer surface of the ring portion, which threads mesh with the threads on the wall of the circular hole 92. By threading the wafer pusher 90 into the circular hole 92, the semiconductor wafer 93 can be fixed in tight contact with the wafer holding surface of the cooling vessel 84.

The space defined by the top of the cooling vessel 84 and the wafer receiving plates 96 is sealed by a cooling vessel lid 94. The semiconductor wafer 93 fixed in the above manner is exposed to reagent vapors only at the area inside of the circumference of the wafer pusher 90. In this way, the area of the wafer surface for the analysis of impurity concentration can be identified.

The diameter of a semiconductor wafer used in this embodiment is 6 inches. The diameter of the circular hole 92 formed in the wafer receiving plate 96 is 14 cm, the inner diameter of the wafer pusher 90 is 13 cm, the outer diameter of the apex of the threads is 14 cm, the maximum diameter the flange is 16 cm, and the inner diameter of the reaction unit 16 is 22 cm.

The diameter of the circular inner space 91 of the cooling vessel 84 is about 13 cm, the thickness is 1 cm, and the wall of the cooling vessel 84 is about 2 mm. The inner diameters of the cooled water supply and drain paths 86a and 86b and cooled water path 86c are about 6 mm, the gap between the outer surface of the cooling vessel and wafer receiving plate is 3 mm, the thickness of the threaded portion of the wafer pusher 90 is 10 mm, and the thickness of the flange portion is 7 mm. These values are only illustrative, and not intended to be limitative. The values may be changed with the wafer size or the like.

Next, there will be described a method of detecting trace substance on a semiconductor wafer surface by using the embodiment vapor phase treatment apparatus.

Four silicon wafers with a thermally oxidized $SiO_2$ film being formed to 1000 angstroms on the surface of the wafers were held on opposite side walls of the cooling vessels 84 and fixed by using the wafer pushers 90. The cooling vessel lids 94 were mounted on the cooling vessels 84, and the specimen holder 18 was placed in the reaction unit 16 at the predetermined position. The fastening rings 88a and 88b were tightened and the movable lid 16c was covered to make the inside of the reaction unit 16 air tight. The valves V15 and V12 were opened to introduce a high purity nitrogen gas from the gas introducing means 15 and provide a nitrogen atmosphere in the inside of the reaction unit 16. Cooled water was flown to lower the temperature of the cooling vessels to 7° C.

The container 2 accommodating hydrofluoric acid aqueous solution of 38 weight % was heated to 80° C. by the heating means 5. The concentration of the hydrofluoric acid aqueous solution of 38 weight % was selected so that a concentration change of the hydrofluoric acid aqueous solution to be caused by evaporation can be avoided because both the water and hydrofluoric acid are vaporized at that concentration. The valves V11 and V14 were opened to flow a high purity nitrogen gas at the flow rate of 0.7 l per minute from the gas introducing means 14 until a steady state was obtained.

The gas supply system 8 and reaction unit 16 were heated to a steady state of 80° C. The valves V15 and V11 were closed and the valve V8 was opened to introduce the mixed gas of water vapors and nitrogen gas into the reaction unit 16. The $SiO_2$ films on the surfaces of the semiconductor wafers 98 were dissolved by the hydrofluoric acid vapors and fine droplets of several tens fm to several hundreds fm were formed on the surfaces of the wafers.

After about three hours, the valve V8 was closed and the valve V11 was opened to stop supplying the mixed gas. The valve V15 was opened to purge the residual gas in the reaction unit 16 and make the inside of the reaction unit 16 have a nitrogen atmosphere. The lid 16c was removed and the fastening rings 88a and 88b were loosened to move the specimen holder 18 to the opening end of the reaction unit 16.

A high purity nitrogen gas was blown down to the semiconductor wafers to collect hydrofluoric acid droplets formed on the semiconductor wafers at the lower ends of the exposed semiconductor wafers. The hydrofluoric acid droplets including impurities collected at the lower ends of the wafers were picked up by a micro piper. Blowing the nitrogen gas and picking up by the micro piper were repeated to recover the droplets from the four semiconductor wafers.

The recovered liquid was quantitatively analyzed by polarization Zeeman spectroscopy with graphite reactor. The quantitative analysis lower limits for Fe, Al, Ni, and Cu were $6*10^9$ atms/cm$^2$, $1*10^{10}$ atms/cm$^2$, $2*10^{10}$ atms/cm$^2$, and $6*10^9$ atms/cm$^2$, respectively.

In this embodiment, the analysis efficiency can be improved because four semiconductor wafers can be accommodated in the reaction unit 16 and processed at the same time.

In this embodiment, the temperature of the cooling vessel 84, i.e., the temperature of the semiconductor wafer 93 is set to 7° C. This temperature may be another temperature lower than the dew point temperature at which droplets can be formed on a semiconductor wafer surface.

Figure 21:
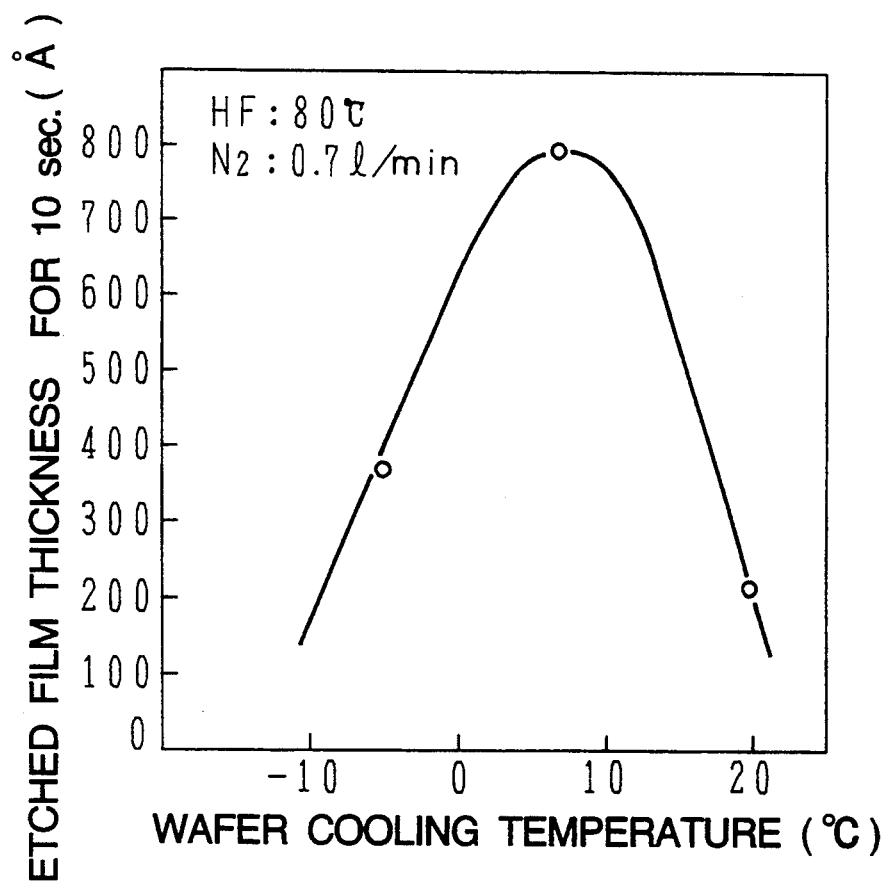
FIG. 21 is a graph showing the relationship between the etching time and the wafer cooling temperature according to the fifth embodiment.

FIG. 21 is a graph showing a change in the $SiO_2$ film etching speed relative to a semiconductor wafer temperature. The abscissa represents a semiconductor wafer temperature, and the ordinate represents a thickness of an etched $SiO_2$ film during ten seconds. The etched conditions were as follows. The temperature of the hydrofluoric acid aqueous solution accommodated in the container was 80° C., and the flow rate of the $N_2$ carrier gas was 0.7 l/min. The maximum value of the etched film thickness was 793 angstroms at the semiconductor wafer temperature of 7° C., and 362 angstroms and 204 angstroms respectively at the semiconductor wafer temperatures of 5° C. and 20° C.

The reason for such results is conceivable from that droplets become icy as the temperature lowers and the supply of water operating as a catalysis for the reaction of $SiO_2$ with hydrofluoric acid vapors reduces, and from that water on a semiconductor wafer surface is likely to be dried as the temperature rises and the supply of water reduces. As seen from the graph shown in FIG. 21, it can be understood that the semiconductor wafer temperature is preferably from −10° C. to 20° C., more preferable from 0° to 15° C., and optimum near at 7° C.

Figure 22A:
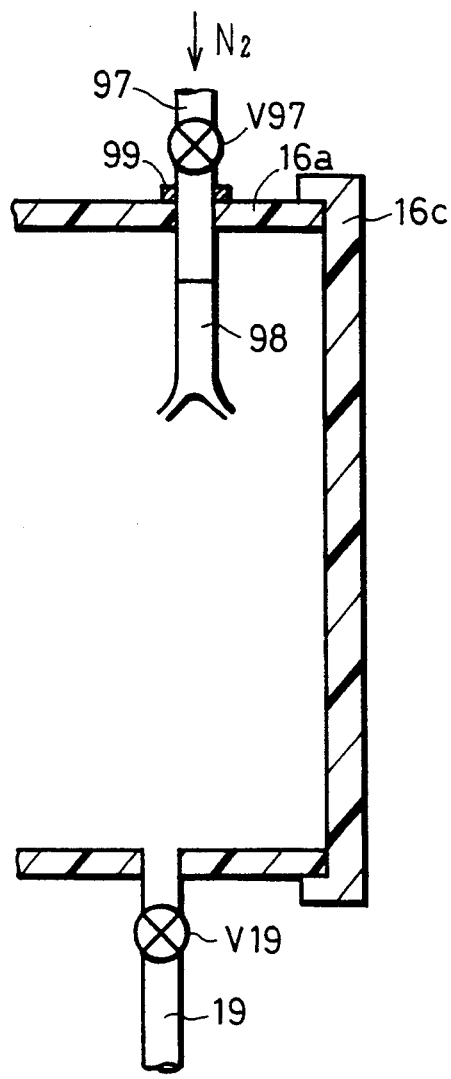
FIGS. 22A and 22B are partial cross sectional views of the reaction unit which is a modification of the fifth embodiment.
Figure 22B:
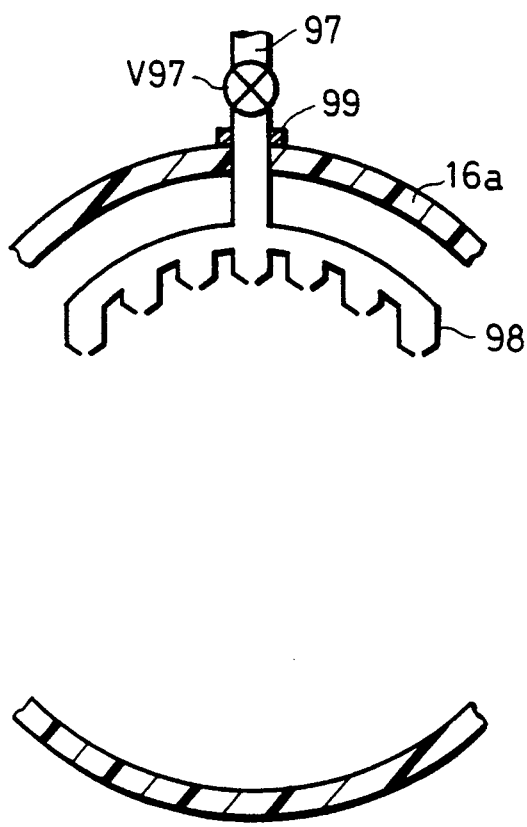

A modification of the fifth embodiment will be described with reference to FIGS. 22A and 22B. FIG. 22A is a partial view in section of a reaction unit broken along the center axis of the cylindrical reaction unit, and FIG. 22B is a partial view in section of the reaction unit broken along the plane perpendicular to the center axis.

A nozzle 98 for blowing nitrogen gas is mounted on the side wall 16a of the reaction unit on the side of a specimen holder dismounting opening. A gas outlet port of the nozzle 98 is inserted into the side wall 16a, and connected to the gas introducing means 97 via a valve V97.

The inserted portion of the gas outlet port is squeezed by a fastening ring 99 to make the inside of the reaction unit 16 air tight. The gas outlet port of the nozzle is divided into a plurality of outlet ports. By loosening the fastening ring 99, the nozzle 98 can be moved up and down. Therefore, gas can be blown over the whole surface of a semiconductor wafer.

By mounting the gas blowing nozzle 98 on the reaction unit 16, droplets can be collected at the lower end of a semiconductor wafer without moving it to the outside of the reaction unit 16. Re-contamination of droplets by an external air can be further suppressed.

The sixth embodiment of the invention will be described with reference to FIGS. 23A to 24B. The purified gas generator used is the same as the fifth embodiment shown in FIG. 18.

FIG. 23A is a front view of a specimen holder 18 of the sixth embodiment, and FIG. 23B is a cross sectional view of the specimen holder 18. Two flat cooling vessels 84 having an octagonal outer shape like the fifth embodiment are fixed to the upper surface of a cooling vessel support 85. An circular inner space 91 is formed in the cooling vessel 84. Cooled water is supplied from a cooled water supply path 86a into the circular inner space 91, and drained via a cooled water path 86c and a cooled water drain path 86b.

A plurality of vacuum suction holes 101 are formed on opposite side walls of each cooling vessel 84 at the positions slightly outside of the outer circumference of the circular inner space 91, and slightly inside of the outer circumference of a semiconductor wafer held in position. Each vacuum suction hole 101 is communicating with a circular vacuum suction path 102 surrounding the circular inner space 91 and formed in the cooling vessel 84.

The vacuum suction path 102 is connected to another vacuum suction path 103 formed in the cooling vessel support 85 along its longitudinal direction. The vacuum suction path 103 is connected to a vacuum suction means (not shown) like the case of the cooled water supply and drain paths 86a and 86b, and extended out of the reaction unit 16.

The vacuum suction means makes the vacuum suction paths 103 and 102 vacuum so that the semiconductor wafers 93 can be fixed in tight contact with the opposite side walls of the cooling vessel 84. In order to facilitate the positioning of the semiconductor wafers 93, protrusions 104 may be formed on the opposite sides of the cooling vessel 84 at the predetermined positions for riding the semiconductor wafers on the protrusions.

By fixing the semiconductor wafers 93 through vacuum suction, the whole surfaces of the semiconductor wafers 93 can be exposed and processed.

Figure 24A:
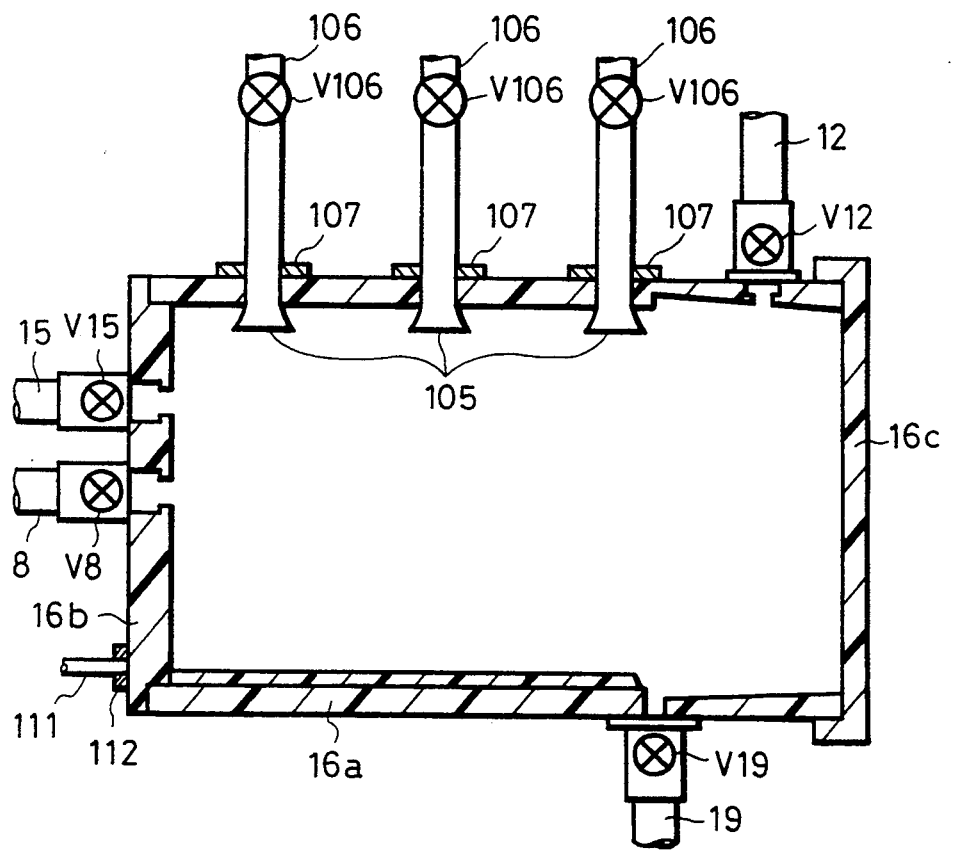
FIGS. 24A and 24B are cross sectional views showing the reaction unit of the sixth embodiment.
Figure 24B:
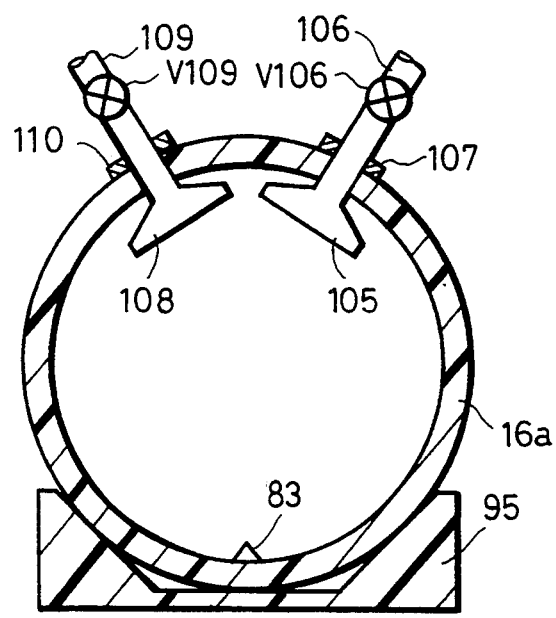

FIGS. 24A and 24B show the reaction unit of the sixth embodiment. FIG. 24A is a cross sectional view of the reaction unit broken along the center axis of the cylindrical reaction unit, and FIG. 24B is a cross sectional view of the unit broken along the plane perpendicular to the center axis. Like the fifth embodiment, the reaction unit includes a cylindrical side wall 16a, a fixed lid 16b, and a removable lid 16c.

The gas supply system 8 with the valve V8 shown in FIG. 18 is mounted generally at the center of the fixed lid 16b at the position slightly displaced from the center, and is open to the inside of the reaction unit 16 to introduce a nitrogen gas and purge residual reagent vapors in the reaction unit 16 after the reaction.

Three pure water shower nozzles 105 for jetting out pure water are mounted on the upper side wall 16a along the center axis. Each pure water shower nozzle 105 is formed at the positions between adjacent cooling vessels 84 so that pure water can be efficiently jetted out to the surfaces of the semiconductor wafers 93 held at the predetermined positions in the reaction unit 16.

The pure water shower nozzle 105 is inserted into the side wall 16a and connected via a valve V106 to a pure water supplying means 106. The inserted portion of the pure shower nozzle 105 is squeezed by a fastening ring 107 to maintain the inside of the reaction unit air tight.

By loosening the fastening ring 107, it is possible to control the position of the tip of the pure shower nozzle 105 in the reaction unit 16. By changing the insertion depth of the pure shower nozzle 105 in the reaction unit 16, it is possible to blow pure water to the whole surface of the semiconductor wafer 93.

As shown in FIG. 24B, flat jet nozzles 108 are mounted on the side wall 16a at the same circumferences on which the corresponding pure water shower nozzles 105 are mounted, at positions slightly apart from the pure water shower nozzles 105.

Each flat jet nozzle 108 is inserted into the side wall 16a and connected to a nitrogen gas supplying means 109 via a valve V109. The inserted portion of the flat jet nozzle 108 is provided with a fastening ring 110 like the pure water shower nozzle to change the insertion depth of the tip of the flat jet nozzle 108 in the reaction unit 16.

The semiconductor wafer 93 can be dried in a clean atmosphere by blowing a nitrogen gas to the wafer surface while gradually increasing the insertion depth of the tip of the flat jet nozzle 108.

A pipe 12 with a valve V12 is connected to the upper side wall 16a to take out reagent vapors after the reaction. It is preferable to mount the pipe 12 at the position as far as possible from the opening of the gas supply system 8 in order to provide a uniform supply of hydrofluoric acid vapors to the reaction unit 16. A drain 19 with a valve V19 is connected to the lower side wall 16a similar to the fifth embodiment.

Similar to the fifth embodiment, cooled water introducing and draining means 81a and 81b are inserted into the fixed lid 16b for the supply and drainage of the cooled water. A vacuum suction means 111 is connected to a vacuum suction path or pipe which is inserted in the fixed lid to vacuum-suck vacuum suction holes 101 formed in the cooling vessel. The inserted portion of the vacuum suction pipe is provided with a fastening ring like the cooled water introducing means to make the inside of the reaction unit air tight.

Next, a method of cleaning a semiconductor wafer by using the vapor phase treatment apparatus of the sixth embodiment will be described.

A thermal oxidized $SiO_2$ film was formed to a thickness of 1500 angstroms on the surface of a semiconductor wafer. Four semiconductor wafers 93 formed with the $SiO_2$ film were fixed in tight contact with the opposite sides of the cooling vessels 84. Similar to the fifth embodiment, the specimen holder holding the semiconductor wafers was accommodated in the reaction unit 16 at the predetermined position. Hydrofluoric acid vapors were introduced into the reaction unit 16 to dissolve the $SiO_2$ films formed on the semiconductor wafers.

The dissolution conditions were as follows. The temperature of the cooling vessel was 5° C., the temperature of hydrofluoric acid aqueous solution accommodated in the container 2 was 50° C., the flow rate of the carrier gas was 0.2 l/min, and the reaction time was about 5 minutes. The maximum value of the etched film thickness was 798 angstroms at the semiconductor wafer temperature of 7° C., and 862 angstroms and 204 angstroms respectively at the semiconductor wafer temperatures of 5° C. and 20° C.

Next, the residual gas in the reaction unit 16 was purged by high impurity nitrogen gas.

The valve V106 was opened to jet out pure water from the pure water shower nozzles 105 to the surfaces of the semiconductor wafers 93 to wash out hydrofluoric acid droplets. The shower time was about 3 minutes.

The valve V106 was closed and the valve V109 was opened to blow a high purity nitrogen gas to the surfaces of the semiconductor wafers 93 to dry them. Thereafter, the lid 16c was opened to dismount the specimen holder from the reaction unit.

The semiconductor wafer surface cleaned in the above manner has a mirror surface. The surface was inspected by Nanospec, M210 available from Nanometrics, Japan, and it was found that no $SiO_2$ film was left unetched. The impurities on the semiconductor wafer cleansed in the above manner were measured by the method used with the fifth embodiment, and it was found that no impurity was detected in excess of the quantitative analysis limit.

A plurality of semiconductor wafers can be accommodated in the reaction unit 16 and processed at the same time, providing an efficient cleaning and good productivity.

In the sixth embodiment, the pure water washing is performed immediately after the dissolution of the $SiO_2$ film by hydrofluoric acid vapors. A mixed gas of hydrochloric acid gas and nitrogen gas may be supplied to the cooled Si wafer before the pure water washing.

The supply of hydrochloric acid gas generates fine hydrochloric acid droplets on the Si wafer surface, improving the removal operation of metal elements such as Cu and Ni. The hydrofluoric acid vapors may be supplied when supplying the hydrofluoric acid vapors, providing the same effects.

Figure 25:
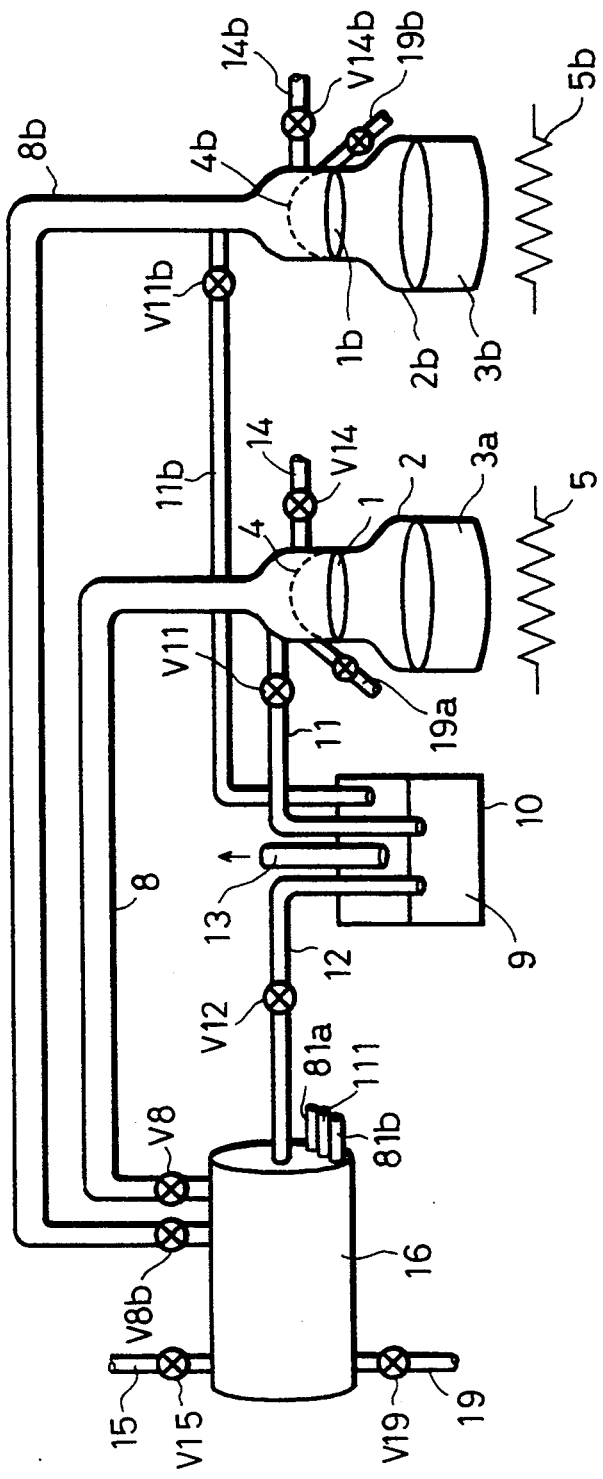
FIG. 25 is a schematic diagram showing the vapor phase treatment apparatus which is a modification of the sixth embodiment.
Figure 26A:
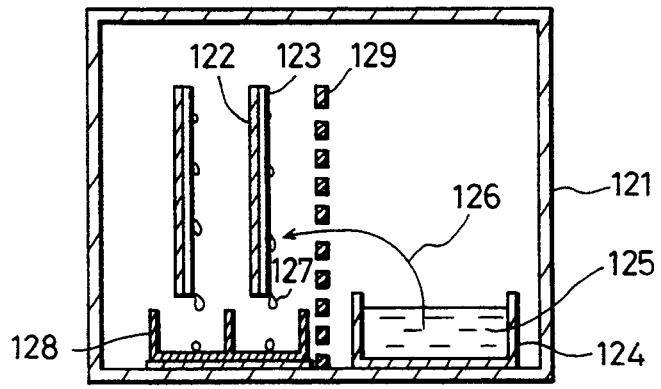
FIGS. 26A and 26B are schematic diagrams in section showing conventional impurity extracting apparatuses.
Figure 26B:
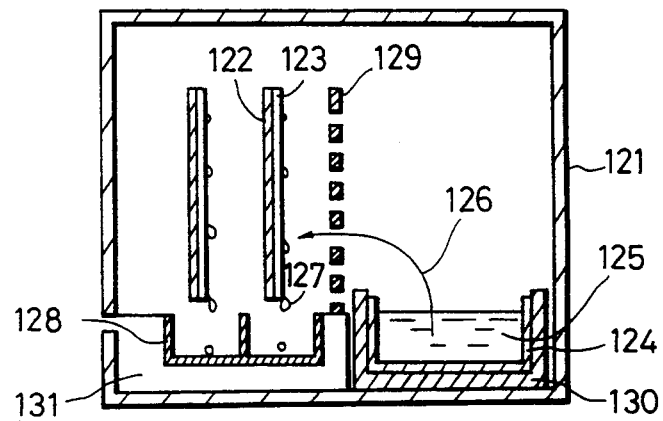
Figure 26C:
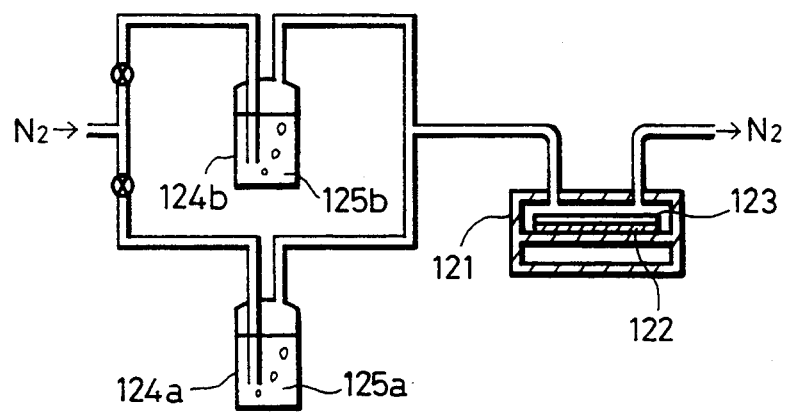
FIG. 26C is a schematic diagram in section showing another conventional impurity extracting apparatus.
Figure 27:
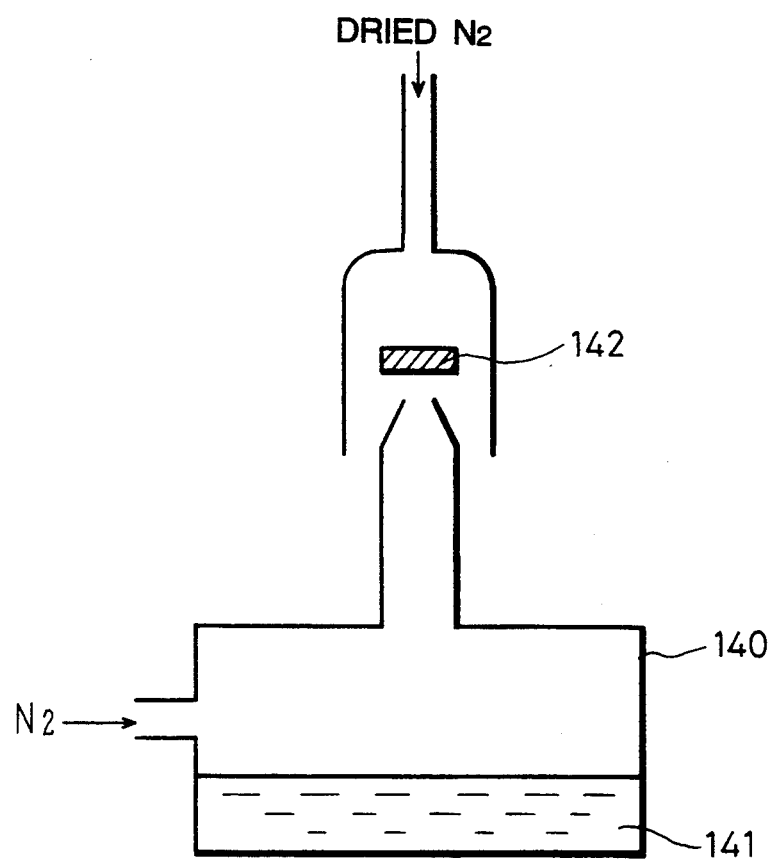
FIG. 27 is a schematic diagram showing the fundamental structure of a conventional vapor phase dissolution apparatus.
Figure 28A:
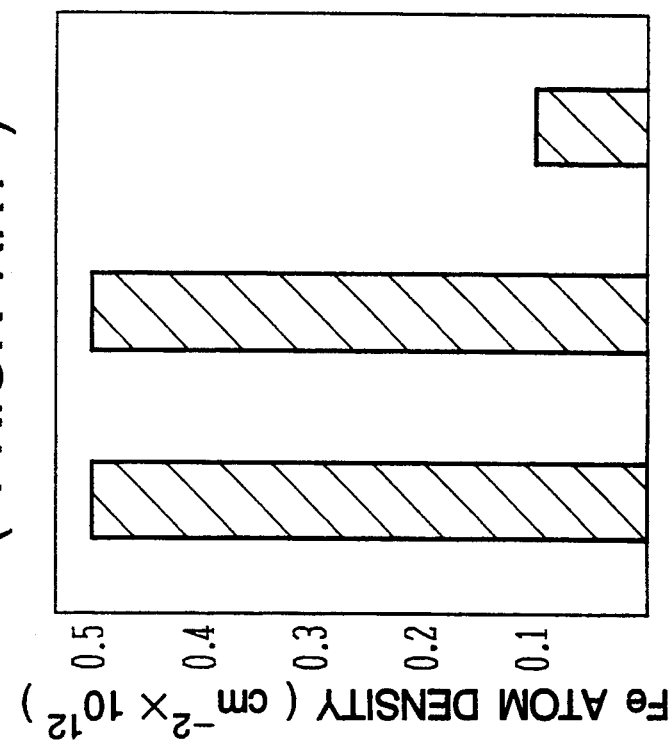
FIG. 28A is a graph showing the densities of Cr atoms on wafer surfaces after and before cleaning according to a conventional technique.
Figure 28B:
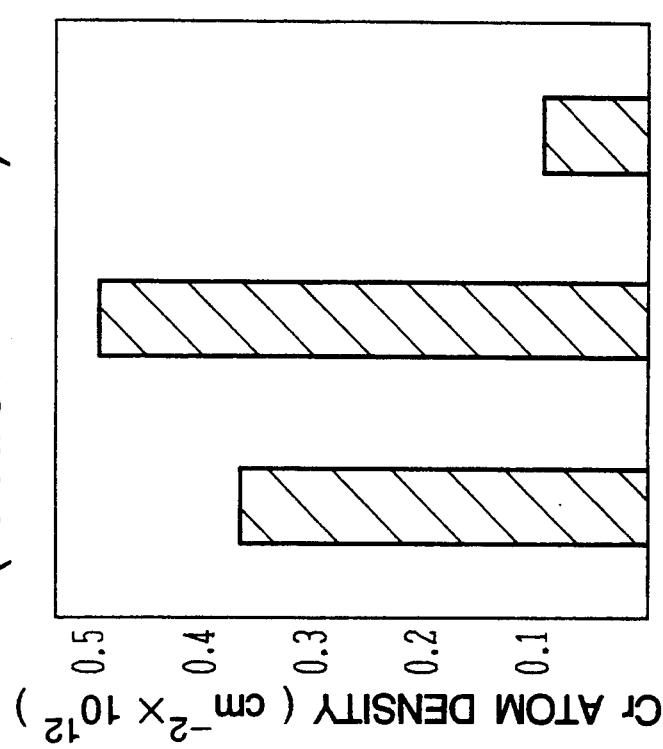
FIG. 28B is a graph showing the densities of atoms on wafer surfaces after and before cleaning according to a conventional technique.

FIG. 25 shows the fundamental structure of the vapor phase treatment apparatus which is a modification of the sixth embodiment capable of supplying hydrochloric acid vapors after supplying hydrofluoric acid vapors or at the same time. The vapor phase treatment apparatus shown in FIG. 25 has another container 2b like the container 2 shown in FIG. 18, a hydrophobic porous film 4b like the film 4 shown in FIG. 18, and another heating means 5b like the means 5 shown in FIG. 18. The containers 2 and 2b accommodate hydrofluoric acid aqueous solution 3a and hydrochloric acid aqueous solution 3b, respectively.

A gas supply system 8b covers the space above the hydrophobic porous film 4b and is connected to a gas supply system 8b via a valve V8b. Although a plurality of hydrofluoric acid vapors supplying valves V8 and a plurality of hydrochloric acid vapors supplying valves V8b are provided in practice, only one valve V8 and one valve V8b are shown in FIG. 25 for the purpose of simplicity. The reaction unit 16 has the same structure as that of the sixth embodiment. Hydrochloric acid vapors from the container 2b are supplied via the gas supply system 8b to the reaction unit 16.

The gas supply system 8b is connected to gas pipes 11b and 14b having valves V11b and V14b. The gas pipe 11b is dipped into exhaust gas processing liquid 9 in an exhaust gas processing vessel 10 to introduce hydrochloric acid vapors into the exhaust gas processing liquid 9.

The gas pipe 14b introduces a carrier gas such as a nitrogen gas. Hydrochloric acid vapors having a desired flow ratio relative to the carrier gas can be supplied to the reaction unit 16 by heating and vaporizing hydrochloric acid aqueous solution in the container 2b and introducing the carrier gas via the gas pipe 14b.

It is preferable to provide liquid drains 19a and 19b communicating with the containers 2 and 2b above the surfaces of the hydrophobic porous film 4 and 4b to drain liquids.

In this embodiment, hydrochloric acid vapors are used for removing metal atoms. Other vapors such as hydrofluoric acid vapors, acetic acid vapors, ammonium vapors, and a mixture of these vapors may also be used to improve the removal operation of metal atoms. It is preferable to dissolve organic substances attached to a semiconductor wafer before the washing process.

In the sixth embodiment, a thermally oxidized $SiO_2$ film formed on the surface of a silicon wafer is dissolved. Other films may also be dissolved, such as an $SiO_2$ film, a BPSG film, and an SiN film, respectively formed by a CVD method.

The selective etching ratios for different films may be changed by changing the etching speed which is changed by the wafer cooling temperature, as explained with FIG. 21.

In the above embodiment, a nitrogen gas is used as the carrier gas and purging gas. Other inert gasses may also be used.

In the fifth and sixth embodiments, two cooling vessels are held by the specimen holder and four semiconductors are processed at the same time. The number of cooling vessels held by the specimen holder may be increased. For example, if five cooling vessels are used, ten semiconductor wafers can be processed at the same time, improving the productivity.

The present invention has been described in connection with the preferred embodiments. The invention is not limited to the embodiments only. It is apparent to those skilled in the art that various changes, improvements, combinations and the like may be made.

We claim:

1. A vapor phase treatment method comprising the steps of:
    heating a liquid reagent and generating a reagent vapor, said reagent vapor being capable of dissolving an object to be treated; and
    supplying said reagent vapor to a cooled specimen, said object being formed on the surface of said cooled specimen.

2. A vapor phase treatment method according to claim 1, further comprising, after said reagent vapor generating step, a step of passing said reagent vapor through a hydrophobic porous film to intercept a mist having a diameter greater than a value and highly purify said reagent vapor.

3. A vapor phase treatment method according to claim 2, further comprising a step of mixing said reagent vapor with an inert gas.

4. A vapor phase treatment method according to claim 3, further comprising a step of adjusting the etching speed to a value by controlling the heating temperature for said liquid reagent and the amount of mixed inert gas.

5. A vapor phase treatment method according to claim 1, wherein said liquid reagent is a hydrofluoric acid aqueous solution, and said object is a silicon oxide.

6. A vapor phase treatment method according to claim 2, wherein said liquid reagent is a hydrofluoric acid aqueous solution, and said object is a silicon oxide.

7. A vapor phase treatment method according to claim 3, wherein said liquid reagent is a hydrofluoric acid aqueous solution, and said object is a silicon oxide.

8. A vapor phase treatment method according to claim 4, wherein said liquid reagent is a hydrofluoric acid aqueous solution, and said object is a silicon oxide.

9. A vapor phase treatment apparatus comprising:
heating means for heating a container for accommodating a liquid reagent;
cooling means for cooling an object to be treated and placed on said cooling means; and
a gas supply system for communicating the opening of said container to the upper area of said cooling means and supplying a reagent vapor generated in said container to said object.

10. A vapor phase treatment apparatus according to claim 9, further comprising a filter member including a hydrophobic porous film and being capable of covering the opening of said container.

11. A vapor phase treatment apparatus according to claim 10, further comprising means for holding said object placed on said cooling means.

12. A vapor phase treatment apparatus according to claim 11, wherein said holding means has a mechanism for exposing an area of said object.

13. A vapor phase treatment apparatus according to claim 10, further comprising a nozzle for blowing a high purity inert gas to said object, and a reaction unit for accommodating said cooling means and said nozzle.

14. A vapor phase treatment apparatus according to claim 13, further comprising means for supplying a nitrogen vapor generated from a liquid nitrogen to said nozzle.

15. A vapor phase treatment apparatus according to claim 14, wherein said nitrogen gas supplying means includes a nitrogen gas purifying unit, a pressure reducing valve, a flow rate valve, and a nitrogen gas filter.

16. A vapor phase treatment apparatus according to claim 13, wherein said cooling means has a flat surface for holding said object horizontally.

17. A vapor phase treatment apparatus according to claim 13, wherein said cooling means has a flat surface for holding said object vertically.

18. A vapor phase treatment apparatus according to claim 13, wherein said cooling means has a flat surface for holding said object obliquely.

19. A vapor phase treatment apparatus according to claim 13, further comprising means for moving said nozzle along the surface of said object.

20. A vapor phase treatment apparatus according to claim 13, wherein said nozzle includes a plurality of outlets for blowing an inert gas to the whole surfaces of said objects at the same time.

21. A vapor phase treatment apparatus according to claim 10, further comprising rinsing/drying means for rinsing and drying said object.

22. A vapor phase treatment apparatus according to claim 21, further comprising a rinsing/drying vessel partitioned from said reaction unit by a shutter for accommodating said ringing/drying means.

23. A vapor phase treatment apparatus according to claim 21, wherein said rinsing/drying means includes pure water introducing means mounted above said object, and a spinner for fixing said object and rotating said object.

24. A vapor phase treatment apparatus according to claim 21, wherein said rinsing/drying means includes first gas introducing means for introducing a dried inert gas into a space where said object is placed, and first gas draining means for draining said gas from said space.

25. A vapor phase treatment apparatus according to claim 22, further comprising an object transporter for transporting said object placed on said cooling means to said rinsing/drying vessel.

26. A vapor phase treatment apparatus according to claim 10, further comprising a reaction unit for accommodating said cooling means, said cooling means including at least two cooling vessels for holding and cooling said objects.

27. A vapor phase treatment apparatus according to claim 26, wherein said cooling means further includes a cooling vessel support for supporting said at least two cooling vessels spaced apart by a distance.

28. A vapor phase treatment apparatus according to claim 10, further comprising heating means for heating said gas supply system.

29. A vapor phase treatment apparatus according to claim 27, wherein a space is formed in said cooling vessel for circulating cooled water, a cooled water supply path for supplying the cooled water to said space and a cooled water drain path for draining the cooled water from said space are formed in said cooling vessel support, said apparatus further comprising cooled water introducing means for introducing the cooled water from the outside of said reaction unit to said cooled water supply path and cooled water draining means for draining the cooled water from said cooled water drain path to the outside of said reaction unit.

30. A vapor phase treatment apparatus according to claim 26, wherein said cooling vessel is provided with vacuum holding means for tightly fixing said object to the surface of said vacuum holding means through vacuum suction.

31. A vapor phase treatment apparatus according to claim 30, wherein a vacuum suction path is formed in said cooling vessel support, said vacuum suction path being communicating with said vacuum holding means and vacuum-sucking the inside of said vacuum holding means, and said apparatus further includes suction means for vacuum-sucking the inside of said vacuum suction path to guide sucked air to the outside of said reaction unit.

32. A vapor phase treatment apparatus according to claim 24, further comprising a shower nozzle for jetting out pure water to said object accommodated in said reaction unit.

33. A vapor phase treatment apparatus according to claim 32, further comprising a Jet nozzle for blowing out droplets attached to the surface of said object accommodated in said reaction unit and for drying said object.

34. A vapor phase treatment apparatus according to claim 24, wherein said cooling means further includes object holding means for tightly fixing said object to the surface of said cooling means while exposing an area of the surface of said object and shielding the other area of the surface.

35. A vapor phase treatment apparatus according to claim 34, further comprising a nozzle for blowing a high purity inert gas to the surface of said object accommodated in said reaction unit and for collecting droplets attached to the surface of said object to the lower surface area.

36. A vapor phase treatment apparatus according to claim 10, further comprising:
   another filter member including a hydrophobic porous film and being capable of covering the opening of another container accommodating another liquid reagent;
   another heating means for heating said other container; and
   another gas supply system for communicating the opening of said other container to the upper area of said cooling means and supplying the reagent vapor generated in said other container to said object.

37. A vapor phase treatment apparatus according to claim 10, further comprising second gas introducing means for introducing an inert gas to said container or said gas supply system.

38. A vapor phase treatment apparatus according to claim 10, further comprising draining means for draining liquids from the space above the opening of said container.

39. A vapor phase treatment apparatus according to claim 10, further comprising draining means for draining liquids in said reaction unit.

40. A vapor phase treatment apparatus according to claim 10, further comprising third gas introducing means for introducing an inert gas into said reaction unit.

41. A vapor phase treatment apparatus according to claim 10, further comprising gas supply system heating means for heating said gas supply system.

42. A vapor phase treatment apparatus according to claim 36, further comprising exhaust gas processing means connected to said draining means.

43. A vapor phase treatment apparatus according to claim 36, further comprising exhaust gas processing means connected to said other draining means.

44. A vapor phase treatment apparatus according to claim 10, further comprising a drain for draining liquids in said gas supply system.

* * * * *